US011802886B2

(12) United States Patent
Binder

(10) Patent No.: US 11,802,886 B2
(45) Date of Patent: *Oct. 31, 2023

(54) ZERO-GAUSS-MAGNET FOR DIFFERENTIAL, TWIST-INSENSITIVE MAGNETIC SPEED SENSORS

(71) Applicant: Infineon Technologies AG, Neubiberg (DE)

(72) Inventor: Gernot Binder, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/933,900

(22) Filed: Sep. 21, 2022

(65) Prior Publication Data

US 2023/0014424 A1    Jan. 19, 2023

Related U.S. Application Data

(63) Continuation of application No. 17/076,240, filed on Oct. 21, 2020, now Pat. No. 11,493,527.

(51) Int. Cl.
| | | |
|---|---|---|
| *G01P 3/487* | (2006.01) | |
| *G01D 5/14* | (2006.01) | |
| *G01R 33/07* | (2006.01) | |

(52) U.S. Cl.
CPC .............. *G01P 3/487* (2013.01); *G01D 5/145* (2013.01); *G01R 33/07* (2013.01)

(58) Field of Classification Search
CPC .......... G01D 5/145; G01P 3/487; G01R 33/07
See application file for complete search history.

(56) References Cited

U.S. PATENT DOCUMENTS

| | | | |
|---|---|---|---|
| 9,933,448 B1* | 4/2018 | Binder | G01D 5/147 |
| 2008/0048651 A1 | 2/2008 | Matsumoto et al. | |
| 2009/0051353 A1* | 2/2009 | Takeya | G01R 33/093 |
| | | | 324/207.21 |
| 2010/0013463 A1 | 1/2010 | Ozaki et al. | |
| 2010/0102801 A1 | 4/2010 | Takahashi et al. | |
| 2021/0262831 A1 | 8/2021 | Foletto et al. | |
| 2022/0120777 A1 | 4/2022 | Binder | |
| 2022/0268803 A1* | 8/2022 | Fontanesi | G01P 3/487 |
| 2022/0276072 A1* | 9/2022 | Dupre | G01D 5/145 |

FOREIGN PATENT DOCUMENTS

| | | |
|---|---|---|
| JP | H0676706 A | 3/1994 |
| JP | H09318389 A | 12/1997 |

* cited by examiner

*Primary Examiner* — Jay Patidar
(74) *Attorney, Agent, or Firm* — Harrity & Harrity LLP

(57) ABSTRACT

A magnetic sensor module includes an axially polarized back bias magnet having a magnet body that radially extends from an inner sidewall to an outer sidewall and a bore that defines the inner sidewall. The axially polarized back bias magnet generates a radial bias magnetic in-plane field about a magnetization axis of the axially polarized back bias magnet in a sensor plane. The magnetic field has a magnetic flux density of substantially zero along the extension of the magnetization axis and along a perimeter of a zero-field closed loop located in the sensor plane. The magnetic sensor module includes a magnetic sensor including a plurality of sensor elements arranged in the sensor plane at locations where the radial bias magnetic in-plane field has the magnetic flux density of substantially zero, including at least two sensor elements being arranged on the perimeter of the zero-field closed loop.

15 Claims, 15 Drawing Sheets

ZERO-GAUSS-MAGNET FOR DIFFERENTIAL, TWIST-INSENSITIVE MAGNETIC SPEED SENSORS

RELATED APPLICATION

This application is a continuation of U.S. patent application Ser. No. 17/076,240, filed Oct. 21, 2020, which is incorporated herein by reference in its entirety.

FIELD

The present disclosure relates generally to sensing a wheel speed, and, more particularly, to magnetic speed sensors.

BACKGROUND

To measure wheel speed (e.g., in an automotive application) typically a ferromagnetic wheel is used in combination with a magnetic sensitive sensor and a magnet mounted to the sensor. The sensor generates output-pulses. A control unit counts the pulses and is able to calculate wheel-speed and actual angle of the rotating wheel, as well as optionally determine the rotation direction of the wheel.

In camshaft sensing applications, a Hall monocell configuration may be used that enables output switching at the tooth edge of a toothed wheel. A z-magnetized back bias sensor in combination with the Bz-sensitive monocell sensor generates a sinusoidal signal as the ferrous target wheel rotates in front of the sensor. The maximum amplitude is achieved when a tooth passes the sensor, while the minimum signal is achieved when the sensor faces a notch of the toothed wheel. Thus, the sensor device switches on the tooth edge.

A benefit in using a Hall monocell sensor is that the sensor is twist-insensitive such that the sensor will work independent from a mounting position regardless of its rotational orientation around its z-axis. Thus, an air-gap between the sensor module and the wheel can be adjusted during mounting using a screw. That is, twisting the sensor module like a screw will adjust the air gap and the rotational orientation of the sensor can be disregarded. Accordingly, the assembly tolerances are relaxed during mounting of the sensor due to the twist-insensitivity.

On the downside, Hall monocell sensors have a disadvantage in terms of stray-field robustness. Stray-fields are magnetic fields that are introduced by external means located in the proximal environment of the sensor. For example, components located within a vehicle (e.g., for hybrid cars due to current rails driving high electrical currents close to the sensing device or due to inductive battery charging) or a currents flowing through a railway of a train system that generates magnetic fields may cause stray-field disturbance.

Alternative to the Hall monocell sensor, differential Hall sensing elements may be used to increase the stray-field robustness. In a differential Hall sensor, two Hall plates are spaced apart. The output signal is calculated by subtracting the Bz signal of the first Hall plate from the Bz signal of the second Hall plate, and a homogeneous stray-field in the z-direction will cancel out due to the differential calculation.

The differential Hall signal has its signal maximum at the rising edge of a tooth of the wheel and its signal minimum at the falling edge of a tooth of the wheel. Thus, in contrast to the Hall monocell sensor, the output of the differential Hall sensor switches on the tooth center and the notch center.

However, because the switching point is different, a vehicle's electronic control unit (ECU) needs to be reconfigured to adjust the switching point. Furthermore, another disadvantage of the differential Hall sensor is that it is not twist-insensitive. Twisting the sensor module around its z-axis, will result in a decreasing signal. The worst case is a twist angle of 90°, where both Hall plates sense the same Bz-field. In this case no differential signal is available and the sensor is not able to detect a tooth or a notch.

Therefore, an improved device that is both stray-field robust and twist-insensitive (i.e., twist independent) may be desirable.

SUMMARY

Magnetic sensor modules, systems and methods are provided, configured to detect a rotation of an object, and, and more particularly, to detect a speed of rotation of an object.

One of more embodiments provide a magnetic sensor module including an axially polarized back bias magnet comprising a magnet body that extends in a radial direction from an inner sidewall to an outer sidewall and a bore that defines the inner sidewall, wherein the axially polarized back bias magnet generates a radially symmetric bias magnetic in-plane field about a center axis of the axially polarized back bias magnet in a sensor plane that is orthogonal to an extension of the center axis, wherein the bore is centered on the center axis and extends along the center axis in an axial direction of the axially polarized back bias magnet, wherein the radially symmetric bias magnetic in-plane field has a magnetic flux density of substantially zero along the extension of the center axis and at a circumference of a zero-field circle located in the sensor plane, wherein the circumference of the zero-field circle is concentric with the extension of the center axis and vertically overlaps with the magnet body in a plan view; and a magnetic sensor including at least three sensor elements arranged in the sensor plane of the magnetic sensor at locations where the radially symmetric bias magnetic in-plane field has a magnetic flux density of substantially zero, wherein the at least three sensor elements are configured to generate measurement values in response to sensing the radially symmetric bias magnetic in-plane field, wherein at least two of the at least three sensor elements are arranged on the circumference of the zero-field circle at substantially equidistant angles about the center axis of the axially polarized back bias magnet.

One of more embodiments provide a magnetic sensor module including an axially polarized back bias magnet comprising a magnet body that extends in a radial direction from an inner sidewall to an outer sidewall and a bore that defines the inner sidewall, wherein the axially polarized back bias magnet generates a radially symmetric bias magnetic in-plane field about a center axis of the axially polarized back bias magnet in a sensor plane that is orthogonal to an extension of the center axis, wherein the bore is centered on the center axis and extends along the center axis in an axial direction of the axially polarized back bias magnet, wherein the radially symmetric bias magnetic in-plane field has a magnetic flux density of zero along the extension of the center axis and at a circumference of a zero-field circle located in the sensor plane, wherein the circumference of the zero-field circle is concentric with the extension of the center axis and vertically overlaps with the magnet body in a plan view; and a magnetic sensor including at least two sensor elements arranged in the sensor plane of the magnetic sensor and further arranged on the circumference of the zero-field circle at substantially equidistant angles about the center axis of the axially polarized back bias magnet.

One of more embodiments provide a magnetic sensor module including an axially polarized back bias magnet comprising a magnet body that extends in a radial direction from an inner sidewall to an outer sidewall and a bore that defines the inner sidewall, wherein the axially polarized back bias magnet generates a radially symmetric bias magnetic in-plane field about a center axis of the axially polarized back bias magnet in a sensor plane that is orthogonal to an extension of the center axis, wherein the bore is centered on the center axis and extends along the center axis in an axial direction of the axially polarized back bias magnet, wherein the radially symmetric bias magnetic in-plane field has a magnetic flux density of zero along the extension of the center axis and at a circumference of a zero-field circle located in the sensor plane, wherein the circumference of the zero-field circle is concentric with the extension of the center axis and vertically overlaps with the magnet body in a plan view; and a magnetic sensor including at least two sensor elements arranged in the sensor plane of the magnetic sensor and the magnetic sensor is arranged on the circumference of the zero-field circle such that the at least two sensor elements are arranged at substantially equidistant angles about the center axis of the axially polarized back bias magnet

BRIEF DESCRIPTION OF THE DRAWINGS

Embodiments are described herein making reference to the appended drawings.

DETAILED DESCRIPTION

Figure 1A:
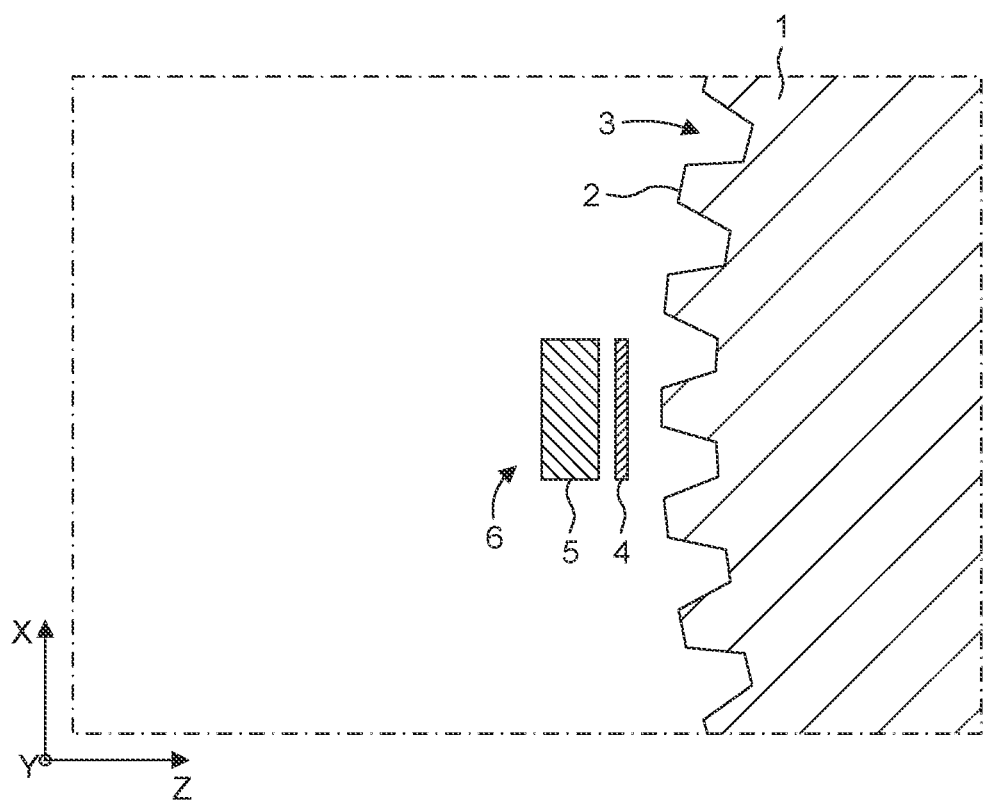
FIGS. 1A and 1B illustrate a magnetic field sensing principle of a toothed wheel according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise. It is also to be understood that other embodiments may be utilized and structural or logical changes may be made without departing from the scope defined by the claims. The following detailed description, therefore, is not to be taken in a limiting sense.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Directional terminology, such as "top", "bottom", "above", "below", "front", "back", "behind", "leading", "trailing", "over", "under", etc., may be used with reference to the orientation of the figures and/or elements being described. Because the embodiments can be positioned in a number of different orientations, the directional terminology is used for purposes of illustration and is in no way limiting. In some instances, directional terminology may be exchanged with equivalent directional terminology based on the orientation of an embodiment so long as the general directional relationships between elements, and the general purpose thereof, is maintained.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

Depending on certain implementation requirements, a storage medium may include a RAM, a ROM, a PROM, an EPROM, an EEPROM, a FLASH memory, or any other medium having electronically readable control signals stored thereon, which cooperate (or are capable of cooperating) with a programmable computer system such that the respective method is performed. Therefore, a storage medium may be regarded as a non-transitory storage medium that is computer readable.

Additionally, instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements. A "controller," including one or more processors, may use electrical signals and digital algorithms to perform its receptive, analytic, and control functions, which may further include corrective functions.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto. A sensor device, as described herein, may be a speed sensor that measures a rotational speed of an object, such as a toothed wheel.

A magnetic field sensor, for example, includes one or more magnetic field sensor elements that measure one or more characteristics of a magnetic field (e.g., an amount of magnetic field flux density, a field strength, a field angle, a field direction, a field orientation, etc.). The magnetic field may be produced by a magnet, a current-carrying conductor (e.g., a wire), the Earth, or other magnetic field source. Each magnetic field sensor element is configured to generate a sensor signal (e.g., a voltage signal) in response to one or more magnetic fields impinging on the sensor element. Thus, a sensor signal is indicative of the magnitude and/or the orientation of the magnetic field impinging on the sensor element.

According to one or more embodiments, a magnetic field sensor and a sensor circuit are both accommodated (i.e., integrated) in the same chip package (e.g., a plastic encapsulated package, such as leaded package or leadless package, or a surface mounted device (SMD)-package). This chip package is also referred to as sensor package. The sensor package may be combined with a back bias magnet to form a sensor module, sensor device, or the like.

One or more magnetic field sensor elements, or for short a magnetic field sensors, included in the sensor package is thus exposed to the magnetic field, and the sensor signal (e.g., a voltage signal) provided by each magnetic field sensor element is proportional to the magnitude of the magnetic field, for example. Further, it will be appreciated that the terms "sensor" and "sensing element" may be used interchangeably throughout this description, and the terms "sensor signal" and "measurement value" may be used interchangeably throughout this description.

The sensor circuit may be referred to as a signal processing circuit and/or a signal conditioning circuit that receives the signal (i.e., sensor signal) from the magnetic field sensor element in the form of raw measurement data and derives, from the sensor signal, a measurement signal that represents the magnetic field. The sensor circuit may include a digital converter (ADC) that converts the analog signal from the one or more sensor elements to a digital signal. The sensor circuit may also include a digital signal processor (DSP) that performs some processing on the digital signal, to be discussed below. Therefore, the sensor package comprises a circuit which conditions and amplifies the small signal of the magnetic field sensor via signal processing and/or conditioning.

A sensor device, as used herein, may refer to a device which includes a sensor and sensor circuit as described above. A sensor device may be integrated on a single semiconductor die (e.g., silicon die or chip), although, in other embodiments, a plurality of dies may be used for implementing a sensor device. Thus, the sensor and the sensor circuit are disposed on either the same semiconductor die or on multiple dies in the same package. For example, the sensor might be on one die and the sensor circuit on another die such that they are electrically connected to each other within the package. In this case, the dies may be comprised of the same or different semiconductor materials, such as GaAs and Si, or the sensor might be sputtered to a ceramic or glass platelet, which is not a semiconductor.

Magnetic field sensor elements include, but is not limited to, vertical Hall effect devices, or magneto-resistive sensors, often referred to as XMR sensors which is a collective term for anisotropic magneto-resistive (AMR), giant magneto-resistive (GMR), tunneling magneto-resistive (TMR), etc.

Figure 1B:
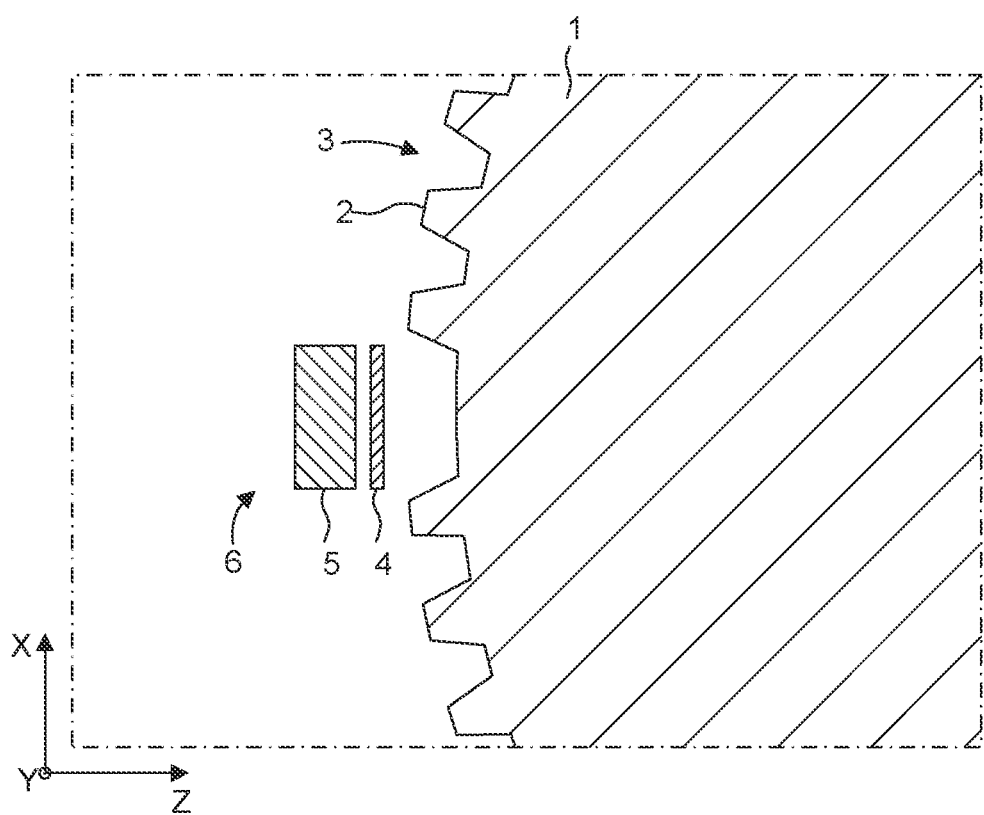

FIGS. 1A and 1B illustrate a magnetic field sensing principle of a toothed wheel 1 that has alternating teeth 2 and notches 3 according to one or more embodiments. In particular, the toothed wheel 1 may be made of a ferromagnetic material (e.g., iron) that attracts magnetic fields. In addition, a sensor arrangement 4 is configured to sense a magnetic field produced by an axially polarized (axially magnetized) back bias magnet 5, where the sensor arrangement 4 and the back bias magnet 5 comprise a sensor module 6. The back bias magnet 5 may be mounted to the back or rear side of the sensor die (i.e., the sensor arrangement 4) relative to the toothed wheel 1, which is placed in front of the sensor die.

The sensor arrangement 4 may generally be referred to herein as a sensor and may be disposed in a sensor package. The axially polarized magnet 5 creates a radially symmetric bias magnetic field in the sensor package plane (i.e., chip plane).

A cylinder with an axial bore or an axial cavity may be used as the axially polarized magnet 5. The magnetic in-plane field (i.e. sqrt($Bx^2+By^2$)) in the sensor plane (i.e., chip plane) produced by the axially polarized magnet 5 is zero at the center of the magnet (i.e., at its center axis), increases in a radial direction from the center axis (e.g., the z-axis as shown), then, due to the axial bore or the axial cavity, the magnetic in-plane field decreases back to zero at a zero-field offset point, and then increases again in the radial direction from the zero-field offset point. Thus, an in-plane magnetic field is created by the magnet 5 with a zero magnetic flux density at the center axis and a zero magnetic flux density located at the zero field offset point. The zero-field offset point located at a radial (i.e., lateral) distance from the center axis and circumferentially surrounds the center axis. In other words, the zero-field offset point is located on a circumference of a zero-field circle 12 that is concentric to the center axis (i.e., the z-axis) and located on the sensor plane of the sensor elements. The in-plane magnetic flux density of the magnetic field produced by the magnet 5 is zero along the circumference of this zero-field circle 12 and along the center axis of the cylinder. There will always be a zero transition of the radial field component due to the bore and this transition occurs at the zero-field circle 12.

The radial distance at which the circumference of the zero-field circle is located depends at least on the diameter of the bore or cavity and a minimum distance between the sensor arrangement 4 (i.e., the sensor plane) and the back bias magnet 5.

Here, the sensor plane(s) of the sensor elements within the sensor arrangement 4 are arranged parallel to the in-plane components of the magnetic field. The sensor planes, as shown in FIGS. 1A and 1B, are aligned in the x and y-directions, perpendicular to each other, and represent the sensitivity-axis of the sensor elements such that the sensor elements are sensitive to the in-plane magnetic field component Bx (i.e., the magnetic field in the x-plane) or to the in-plane magnetic field component By (i.e., the magnetic field in the y-plane) of the sensor arrangement 4. Thus, the sensor elements are sensitive to the radially symmetric bias magnetic field produced by the magnet 5.

FIG. 1A shows a tooth 2 of wheel 1 passing the sensor module 6. In this instance, the magnetic field lines of the radially symmetric bias magnetic field produced by the back bias magnet 5 are pulled in the z-direction towards the tooth 2. Thus, the magnetic field lines are pulled away from the x and y-axes (i.e., the sensor planes) and the sensed magnetic field strength in the x and y-directions is reduced such that a minimum field strength is detected at the center of the tooth 2. This may differ in real-world applications where the minimum may not occur exactly at the center due to assembly tolerances, but the minimum field strength should be detected substantially at the center of the tooth 2.

Conversely, FIG. 1B shows a notch 3 of wheel 1 passing the sensor module 6. In this instance, the magnetic field lines of the radially symmetric bias magnetic field produced by the back bias magnet 5 are not pulled (or less pulled) in the z-direction towards the notch 3. Thus, the magnetic field lines remain concentrated relative to the x and y-axes (i.e., the sensor planes) and the sensed magnetic field strength in the x and y-directions are at a maximum at the center of the notch 3. This may differ in real-world applications where the maximum may not occur exactly at the center, but the maximum field strength should be detected substantially at the center of the notch 3.

As the wheel 1 rotates, the teeth 2 and notches 3 alternate past the sensor module 6 and the sensor elements within the sensor arrangement 4 sense a change in the x-axis and y-axis magnetic field strength that varies as a sinusoidal waveform (i.e., as a signal modulation), the frequency of which corresponds to a speed of rotation of the wheel, which further corresponds to a speed of rotation of a drive shaft (e.g., camshaft) that drives the rotation of the wheel. Thus, the sensor circuit of the sensor arrangement 4 that receives signals (i.e., sensor signals) from the magnetic field sensor elements and derives, from the sensor signals, a measurement signal that represents the magnetic field as a signal modulation. The measurement signal may then be output as an output signal to an external controller, control unit or processor (e.g., an ECU). The external device counts the pulses of the output signal and is able to calculate wheel-speed and an actual angle of the rotating wheel.

Further embodiments relate to a twist-insensitive, differential sensor concept in combination with a zero-gauss back bias magnet 5. Specifically, back-bias magnet 5 comprises a center axis with a bore or a cavity that extends axially along the center axis. The bore may extend in the axial direction fully from one end face of the back-bias magnet 5 to the opposite end face of the back-bias magnet 5. Alternatively, the back-bias magnet 5 may have closed end faces with an internal cavity that partially extends in the axial direction between the two closed end faces (i.e., partially between two end faces that are oppositely arranged from each other in the axial direction). Alternatively, the bore may be open at one end face and closed at the opposite end face of the magnet 5.

In either case, the back-bias magnet 5 is an axially polarized back-bias magnet that generates a radially symmetric bias magnetic field about a center axis of the axially polarized back bias magnet in a sensor plane (e.g., in an x-y plane). The back-bias magnet 5 may be an axially polarized ring magnet (i.e., a cylinder magnet with an axial bore extending therethrough), an axially polarized conical magnet with an axial bore, an axially polarized cubic magnet with an axial bore, and the like.

The sensor die (i.e., the sensor arrangement 4) comprises a minimum of two sensing elements with at least two of the sensing elements located at zero-field offset points that are located on a circumference of a zero-field circle that is concentric to the center axis. In one case, all sensing elements (i.e., two or more) may be located at zero-field offset points that are located on the circumference of the zero-field circle. In another case, one of the sensor elements may be located on the center axis while the other sensor elements may be located at zero-field offset points that are located on the circumference of the zero-field circle. For those sensing elements located on the circumference of the zero-field circle, they are arranged at equidistant angles on the circle with radius r to provide radial symmetry.

The origin of the zero-field circle is aligned with the center axis of the back-bias magnet 5 (i.e., the center of the bore). In this way all sensing elements are exposed to the same low magnetic offset. Ideally, the magnetic offset is 0 mT. Therefore, the back-bias magnet 5 behaves like a zero-gauss magnet. It produces essentially 0 mT magnetic field in the sensor plane at the position of all sensing elements and the sensitive field directions.

The low or zero magnetic field offset offers some crucial advantages. First, in case of a sensor with saturation effects (limited linear range), such as an XMR sensing element, a strong rare-earth magnet can be used without saturating the sensing elements. In particular, XMR sensing elements have a limited linear range. Outside of this linear range, the sensing element enters saturation and the sensor signal becomes unreliable (e.g., it is no longer proportional to the sensed magnetic field). Thus, saturation should be avoided. When XMR sensing elements are placed away from the zero-filed circle, the probability of saturation increases when a strong rare-earth magnet is used as the back bias magnet 5.

The low or zero magnetic field offset enables higher stray-field robustness as the signal-to-stray field ratio is increased. Second, the low or zero magnetic field offset allows implementation of reliable True Power On (TPO) feature. Furthermore, life-time drifts (aging effects of a magnet) and a mismatch of magnet temperature coefficient and sensor temperature coefficient is less critical in case of low or zero magnetic field offsets. Further still, the low or zero magnetic field offset enables the use of strong magnetic material (e.g., a rare-earth material such as NdFeB or SmCo) without the risk of saturating the sensor elements. Using a strong magnetic material enables a high airgap capability between the sensor and the wheel and allows for better manufacturing tolerances.

Additionally, additional advantages of the overall system can be realized, including enhanced stray-field robustness due to differential sensing principle, Twist Insensitive Mounting (TIM) where the differential signal produced is independent from twisting around the z-axis, it is directly possible to sense the shape of the soft magnetic pattern (i.e., tooth→high, notch→low), and it enables small diameter modules (e.g., the back-bias magnet diameter may be 5 mm or less).

Figure 2:
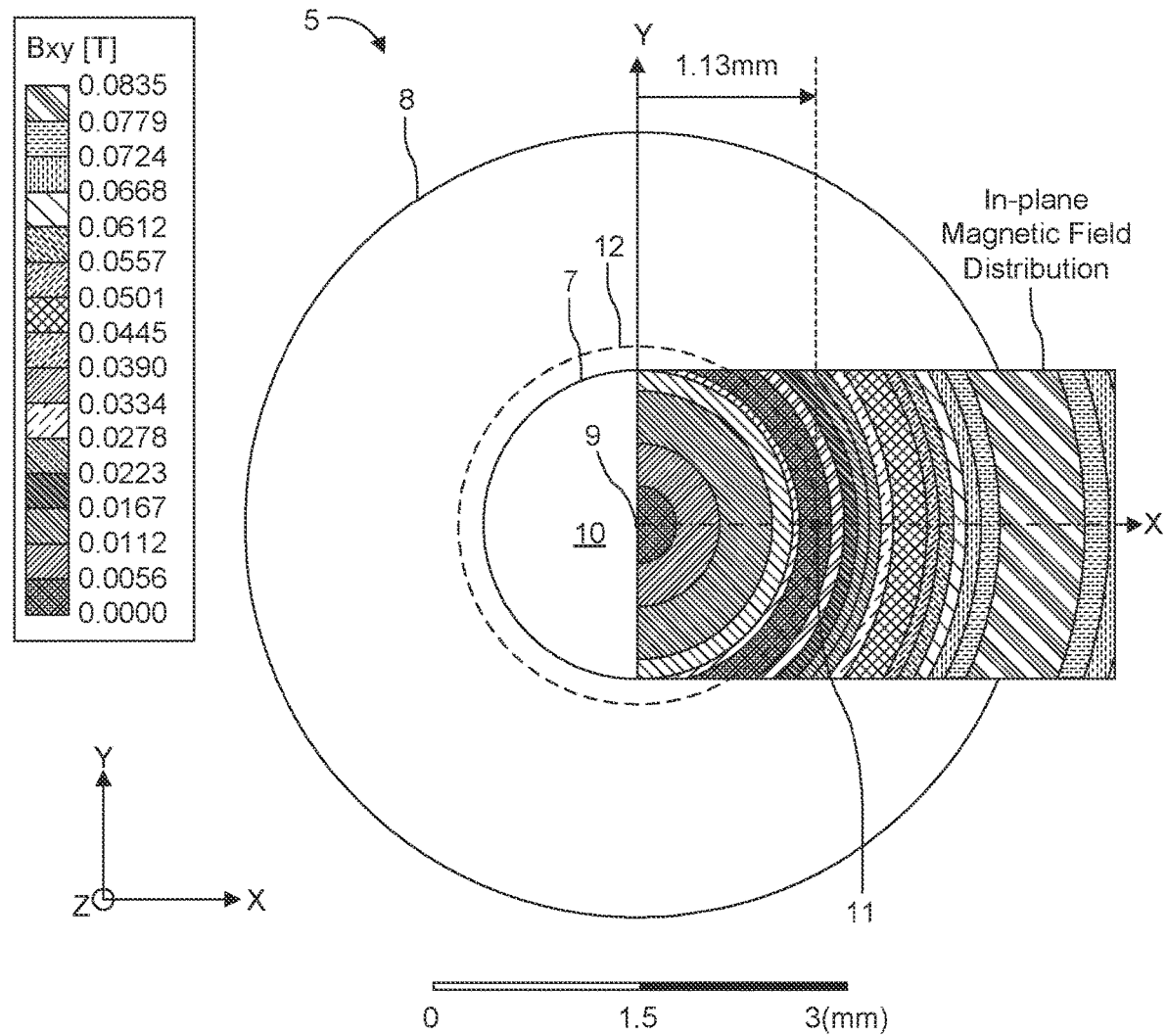
FIG. 2 shows a plan view (top view) of an axially polarized back-bias magnet and its in-plane magnetic field distribution according to one or more embodiments.

FIG. 2 shows a plan view (top view) of an axially polarized back-bias magnet and its in-plane magnetic field distribution according to one or more embodiments. The back-bias magnet 5 includes an inner diameter 7 defined by a bore 10 and further includes an outer diameter 8. The back-bias magnet 5 includes a center axis 9 that extends orthogonal to the x-y sensor plane and to which the inner diameter 7 and the outer diameter 8 are concentric. The back-bias magnet 5 generates a radially symmetric bias magnetic field Bxy about the center axis 9 in the x-y sensor plane, also referred to as an in-plane magnetic field Bxy. The z-axis extends out of the sensor plane, and is consequently referred to as out-of-plane.

As can be seen from the in-plane magnetic field distribution, the magnetic flux density of the magnetic field Bxy is zero at the center of the bore 10 at the center axis 9. The magnetic flux density of the magnetic field Bxy is also zero at a zero-field offset point 11 located on a circumference of a zero-field circle 12 that is concentric to the center axis 9. Because the magnetic field Bxy is radially symmetric about the center axis 9, each point at an equal radial distance from the center axis 9 experience the same magnetic flux density. Thus, each point on the zero-field circle 12 experiences a zero magnetic field offset (i.e., 0 teslas). Sensor elements are to be place at or substantially at (to allow for manufacturing and assembly tolerances) the zero-field circlet 12 such that they are exposed to an in-plane magnetic flux density (i.e., magnetic field offset) of zero or a substantially zero (i.e., <15 mT). In other words, due to considerations of manufacturing and assembly tolerances, one or more sensor elements may be placed proximate to the zero-field circlet 12 where some (i.e., less than 15 mT) residual offset field exists.

The zero-field circle 12, and, thus, the zero-field offset point 11, is located at a radial distance between the inner diameter 7 and the outer diameter 8 of the back bias magnet 5. In other words, the zero-field circle 12 vertically overlaps with the magnet body of the back bias magnet 5 when viewed from a top or plan view, where magnet body extends radially from the inner diameter 7 (i.e., an inner sidewall) to the outer diameter 8 (i.e., an outer sidewall).

The actual location of the zero-field offset point 11 depends on the diameter of the bore 10 and a minimum distance between the sensor arrangement 4 (i.e., the sensor plane) and the back bias magnet 5. The sensing elements of the sensor may be placed at a location with low magnetic offset defined as being less than 15 mT, but ideally are placed at a location where the magnetic field offset is zero (i.e., at the center axis 9 and at the zero-field circle 12).

Figure 3:
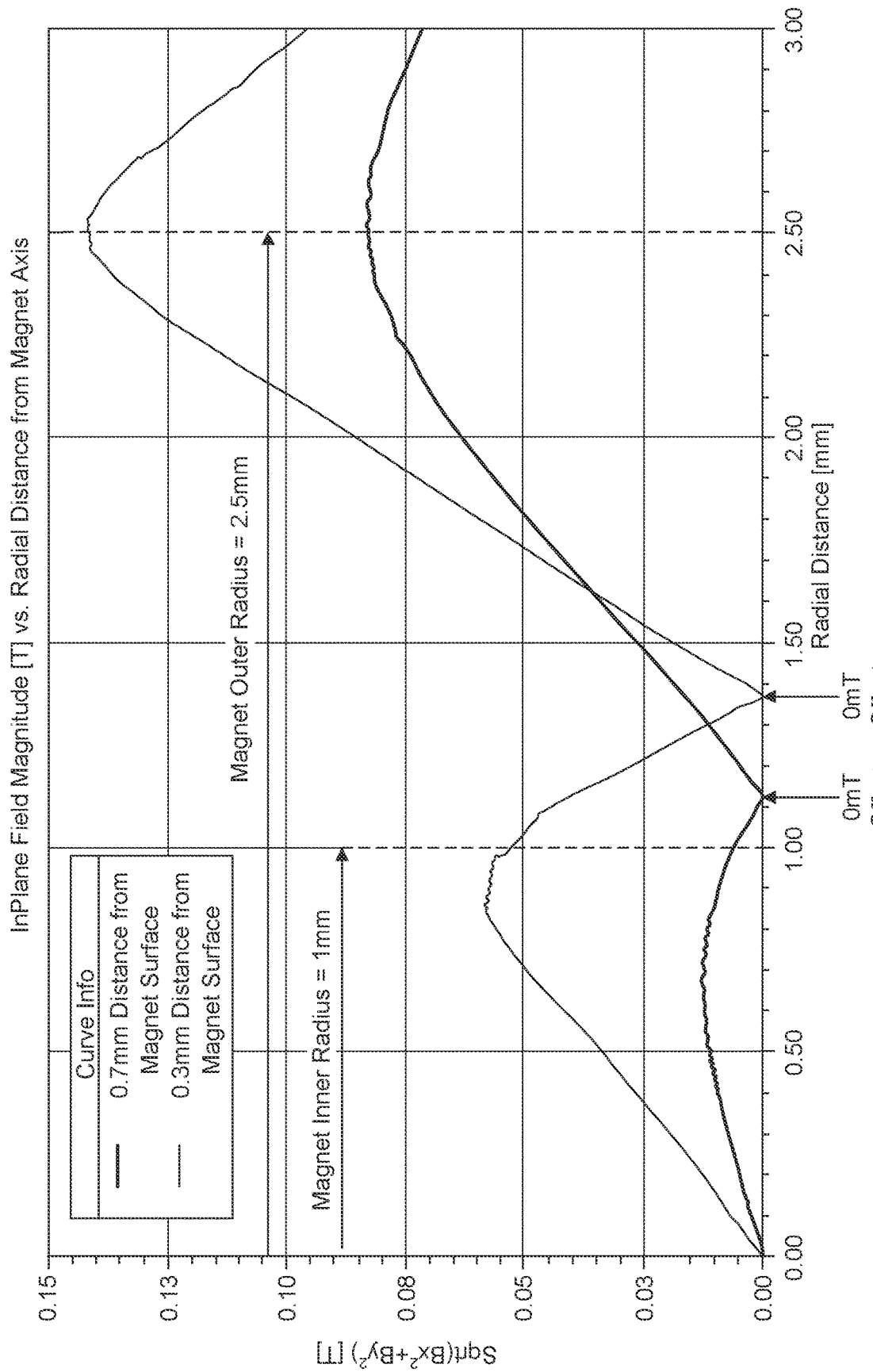
FIG. 3 illustrates a graph that plots the in-plane magnetic field Bxy to a radial distance from center axis of a back bias magnet at different minimum distances taken in a z-direction according to one or more embodiments.

FIG. 3 illustrates a graph that plots the in-plane magnetic field Bxy to a radial distance from center axis of a back bias magnet at different minimum distances taken in a z-direction according to one or more embodiments. There will always be a zero transition of the radial field component due to the bore 10 and this transition occurs at the zero-field circle 12. In particular, a first curve pertains to the in-plane magnetic field Bxy at a first minimum distance of 0.7 mm from the back bias magnet 5 and a second curve pertains to the in-plane magnetic field Bxy at a second minimum distance of 0.3 mm from the back bias magnet 5. Each minimum distance is a z-distance from a nearest end of the back bias magnet 5 relative to the sensor arrangement 4 that defines the sensor plane. The diameter of the bore 10 is the same for both curves.

It is noted that the bore 10 axially extends from one end face of the back bias magnet 5 to an opposite, second end face of the back bias magnet 5 with the ends of the bore 10 exposed. However, in other cases, the bore 10 may be completely enclosed within the magnet body of the magnet 5 as long as a zero magnetic field offset (i.e., zero in-plane magnetic flux density) is created at both the center axis 9 and the zero-field circle 12.

Turning back to FIG. 3, the first curve shows a zero magnetic field offset (i.e., magnetic flux density) is present at the center axis 9 (i.e., 0 mm) and about 1.13 mm, where the inner diameter is located at a radial distance of 1 mm from the center axis 9 and the outer diameter is located at a radial distance of 2.5 mm from the center axis 9. In contrast, the second curve shows a zero magnetic field offset is present at the center axis 9 (i.e., 0 mm) and about 1.38 mm. Thus, minimum distance at which the sensor arrangement 4 is arranged can be configured according to the desired sensor pitch between sensing elements. It is also noted that as a result of the increased minimum distance, the first curve has a gradient of the field vs. radial position that is much lower compared to the second curve.

Figure 4:
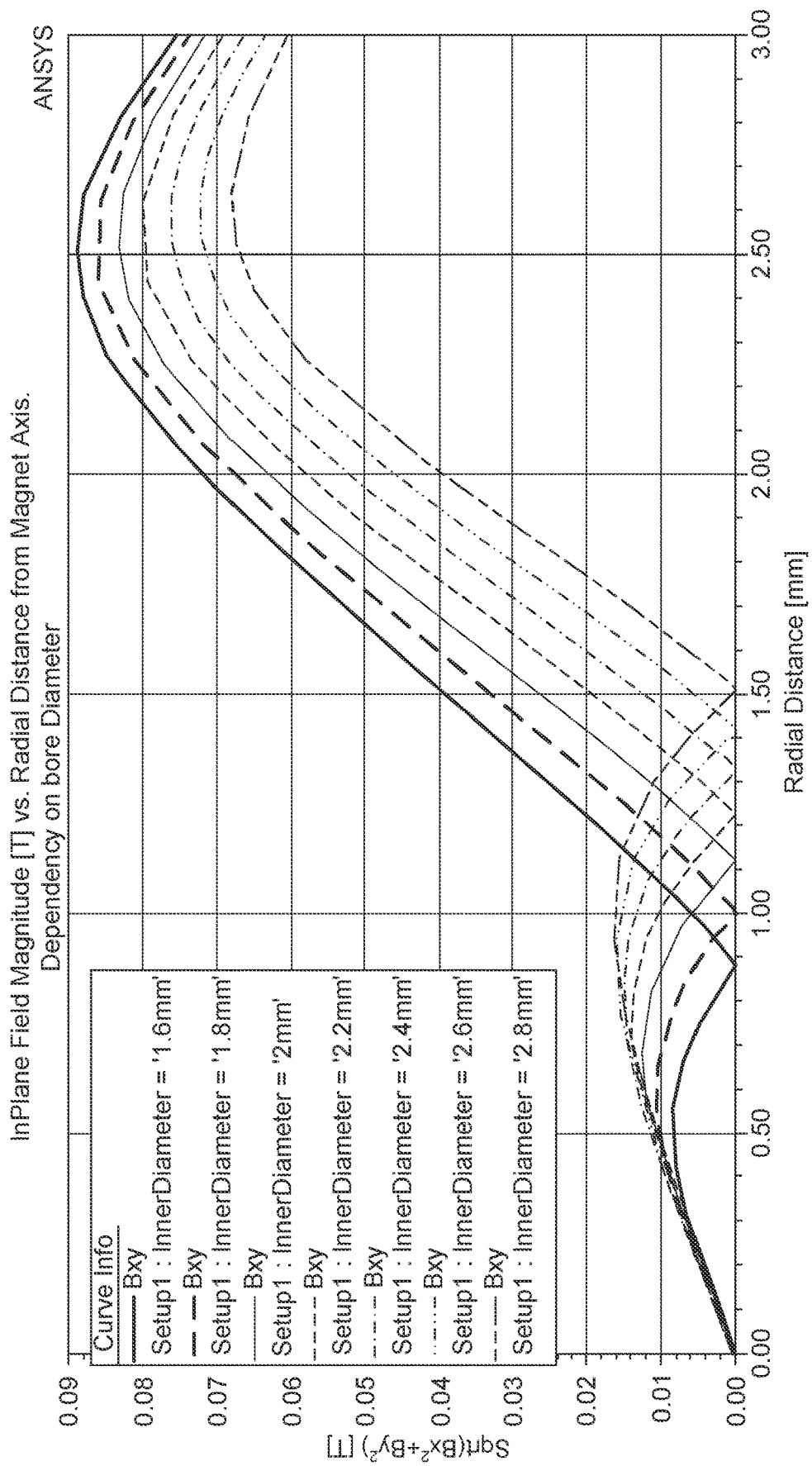
FIG. 4 illustrates a graph that plots a dependency of in-plane magnetic field Bxy on bore diameter according to one or more embodiments.

FIG. 4 illustrates a graph that plots a dependency of in-plane magnetic field Bxy on bore diameter according to one or more embodiments. In particular, several curves are provided for the in-plane magnetic field Bxy where the diameter of bore 10 varies from 1.6 mm to 2.8 mm by increments of 0.2 mm. As can be seen, a zero magnetic field offset is present at the center axis 9 (i.e., 0 mm) for all curves. However, the radial distance of the zero-field circle 12 where the second zero magnetic field offset is present increases with increasing bore diameter.

For a constant magnet outer dimension and constant minimum distance (in this case 0.7 mm z-distance of the sensor arrangement to the magnet 5), the position of the zero-field offset can be adjusted by changing the bore diameter. A smaller diameter leads to smaller sensor pitch. Often due to module assembly constrains, the outer magnet diameter is limited. Thus, for a fixed outer diameter, the position of the zero-field offset can be adjusted with the bore diameter. Note that this sensor also realizes small diameter modules, as the magnet 5 has an outer diameter of only 5 mm due to the placement of sensing elements on or substantially on the zero-field circle 12. The reduced magnet size in an improvement over other sensor modules that do not have such a configuration. However, it will be appreciated that the embodiments described herein are not limited by any specific dimension of the magnet 5.

Figure 5:
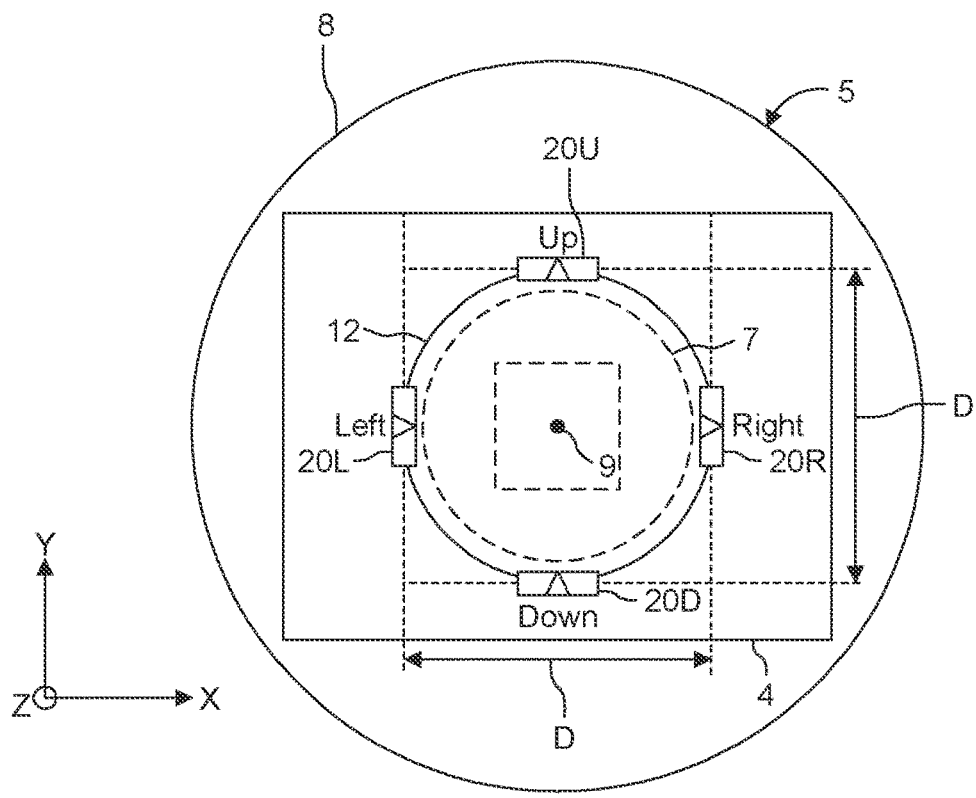
FIG. 5 illustrates a plan view of a sensor module, including a sensor arrangement arranged over a back bias magnet, according to one or more embodiments.

FIG. 5 illustrates a plan view of a sensor module, including a sensor arrangement arranged over a back bias magnet, according to one or more embodiments. As used herein, the sensor arrangement 4 may also be referred to as a sensor chip layout, single die sensor or magnetic sensor and includes at least two magnetic field sensor elements. In this case, four magnetic field sensor elements 20L, 20R, 20U, and 20D (collectively referred to as sensor elements 20) are provided. The sensor chip also includes a sensor circuit 21. The sensor elements 20 are arranged on a circumference of the zero-field circle 12 with equidistant spacing from each other. Thus, the sensor elements 20 are spatially distributed equally about a center axis 9 of the zero-field circle 12 such that all sensor elements 20 are exposed to substantially the same (due to typical assembly tolerances of 3%), or exactly the same magnetic field working point. The zero-field circle 12 has a diameter D.

The magnetic flux density of the magnetic field changes symmetrically in a radial direction from the center axis (e.g., from the z-axis as shown) as described above. For example, the magnetic flux density of the radially symmetric magnetic in-plane field produced by the axially polarized magnet 5 is zero at the center of the magnet (i.e., at its center axis) and, due to the bore 10, also at the zero-field circle 12. Aside from those two locations, the radially symmetric magnetic flux density is non-zero in accordance with aforementioned details. Thus, the center point of the zero-field circle 12 coincides with the center axis 9 of the magnet 5 so that each sensor element 20 is exposed to substantially the same (due to typical assembly tolerances of 3%), or exactly the same magnetic in-plane field (i.e., magnetic offset).

Each point on the zero-field circle 12 experiences a zero magnetic flux density. In a preferred case, all sensor elements 20 are exposed to a zero in-plane magnetic field Bxy. As a result of their arrangement on the zero-field circle 12 that is generated due to the bore 10 or substantially proximate to the zero-field circle 12, all sensor elements are always operated in linear mode (i.e., non-saturated mode) regardless of the overall magnetization strength of the magnet 5. It is noted that the out-of-plane magnetic field Bz is not a consideration since the sensor elements 20 are configured via their respective sensing axes to measure an in-plane magnetic field component (i.e., either the Bx magnetic field component or the By magnetic field component).

The sensor elements 20 may be, for example, single-axis or multi-axis XMR sensor elements that have a sensing axis utilized for the speed sensor that is aligned with one of the in-plane magnetic field components Bx or By. Here, as similarly described above with reference to FIGS. 1A and 1B, it is assumed for this example that the back bias magnet 5 produces a radially symmetric bias magnetic field. Additionally, each sensor's transfer function has a high linear range (minimum of +/−25 mT or greater) and is in a wide range independent from bias fields. That is, each sensor element 20 is sensitive to a first magnetic in-plane field component (e.g., a Bx component) and, at the same time, it is independent from (or insensitive to) a second, different magnetic in-plan field component (e.g., a By component).

The arrows on each sensor element 20 indicate a direction of the reference layer of the sensor element 20 having a reference direction such that the reference direction of sensor elements 20L, 20R are the same and the reference direction of sensor elements 20U, 20D are the same. Thus, sensor elements 20L and 20R share their same reference direction, and sensor elements 20U and 20D share their own same reference direction. Moreover, the sign of the pairwise reference directions is also invertible. This means in another embodiment, sensor elements 20L and 20R may also be sensitive to the −Bx direction, while sensor elements 20U and 20D may be sensitive to the −By direction. Accordingly, if the magnetic field points exactly in the same direction as the reference direction, the resistance of the XMR sensor element is at a maximum, and, if the magnetic field points exactly in the opposite direction as the reference direction, the resistance of the XMR sensor element is at a minimum.

According to this example, oppositely disposed sensor elements 20L and 20R may have a sensing axis in the x-direction configured for sensing the in-plane magnetic field component Bx (i.e., sensitive to magnetic fields in the x-plane). Similarly, oppositely disposed sensor elements 20U and 20D may have a sensing axis in the y-direction configured for sensing the in-plane magnetic field component By (i.e., sensitive to magnetic fields in the y-plane).

From the four sensors 20, two differential signals are obtained. Depending on the type or use of the sensor the change of magnetic field is translated into a change of resistance, current, or voltage. A first differential signal (e.g., a speed signal) may be calculated as $\Delta 1$=Left−Right or in a magnetic field representation, $\Delta 1$=BxLeft−BxRight. A second differential signal (e.g., a direction signal), phase shifted by 90° from the first differential signal may be calculated as $\Delta 2$=Down−Up or in a magnetic field representation, $\Delta 2$=ByDown−ByUp.

The sensor signals of each sensor element 20 is provided to the sensor circuit 21 that calculates the two differential signals $\Delta 1$ and $\Delta 2$ and/or an output signal using a differential calculation that cancels out the homogeneous stray-fields in the x and y-directions, and out-of-plane magnetic field components do not affect the output signal (i.e., the sensor output). The output signal $R_{OUT}$ or $V_{OUT}$ is calculated, for example, by the following equations:

$$R_{OUT}=R_{LEFT}-R_{RIGHT}-(R_{UP}-R_{DOWN}) \quad (1), \text{ or}$$

$$R_{OUT}=R_{LEFT}-R_{RIGHT}+(R_{DOWN}-R_{UP}) \quad (2),$$

$$V_{OUT}=V_{LEFT}-V_{RIGHT}-(V_{UP}-V_{DOWN}) \quad (3), \text{ or}$$

$$V_{OUT}=V_{LEFT}-V_{RIGHT}+(V_{DOWN}-V_{UP}) \quad (4).$$

Here, $R_{LEFT}$ corresponds to a resistance value of sensor element 20L, $R_{RIGHT}$ corresponds to a resistance value of sensor element 20R, $R_{UP}$ corresponds to a resistance value of sensor element 20U, and $R_{DOWN}$ corresponds to a resistance value of sensor element 20D. Furthermore, $V_{LEFT}$ corresponds to a voltage value of sensor element 20L, $V_{RIGHT}$ corresponds to a voltage value of sensor element 20R, $V_{UP}$ corresponds to a voltage value of sensor element 20U, and $V_{DOWN}$ corresponds to a voltage value of sensor element 20D. Equations (1), (2), (3), and (4) can be generalized as follows:

$$SE_{OUT} = (SE_A - SE_B) + (SE_C - SE_D) \quad (5), \text{ or}$$

$$SE_{OUT} = \Delta 1 + \Delta 2 \quad (6),$$

where SE corresponds to sensor element, and $SE_A$ and $SE_B$ correspond to a first pair of oppositely disposed sensor elements, and $SE_C$ and $SE_D$ correspond to a second pair of oppositely disposed sensor elements.

As the sensor elements 20 are XMR sensor elements, the resistance values change depending on the magnetic field strength in the direction of the sensing axis, and the resistance values of the XMR sensor elements may be detected by the sensor circuit 21 or may be output from the senor element as a voltage value that is representative of the resistance value (i.e., the voltage value changes as the resistance value changes). In the former case, the resistance value is output as a sensor signal, and, in the latter case, the voltage value is output as a sensor signal, however, the sensor signal is not limited thereto. Thus, external stray-fields in the sensor plane will cancel out due to the differential calculus and out-of-plane magnetic field components do not affect the sensor output. When mounted in front of a ferromagnetic target wheel 1, the sensor output is independent from the sensor's twisting around the magnet axis 9. As a result, the output signal $SE_{OUT}$ will not change its phase, which means it is twist-independent.

Alternatively, the sensor elements 10 may be, for example, vertical Hall sensor elements that have a sensing axis utilized for the speed sensor that is aligned with one of the in-plane magnetic field components Bx or By. In vertical Hall sensor elements, voltage values output by the sensor elements 10 change according to the magnetic field strength in the direction of the sensing axis. Thus, external stray-fields in the sensor plane will cancel out due to the differential calculus and out-of-plane magnetic field components do not affect the sensor output.

Thus, oppositely disposed sensor elements 20L and 20R may have a sensing axis aligned in the x-direction configured for sensing the in-plane magnetic field component Bx (i.e., sensitive to magnetic fields in the x-plane). Similarly, oppositely disposed sensor elements 20U and 20D may have a sensing axis aligned in the y-direction configured for sensing the in-plane magnetic field component By (i.e., sensitive to magnetic fields in the y-plane).

In addition, the sensor module 6 includes an axially polarized cylinder magnet 5, where its center axis 9 points towards the wheel 1 and coincides with the center of the inner diameter 7, the center of the zero-field circle 12, and the center or the outer diameter 8. Thus, the magnet creates a radially symmetric bias magnetic field in the sensor plane such that each sensor element 20 is exposed to substantially the same (due to typical assembly tolerances of 3%), or exactly the same magnetic field working point. The magnet may be any shape that produces a radially symmetric magnetic field (e.g., cylinder, cube, etc.) and further includes a bore (open-ended or closed-ended) that produces the zero-field circle 12.

Figure 6:
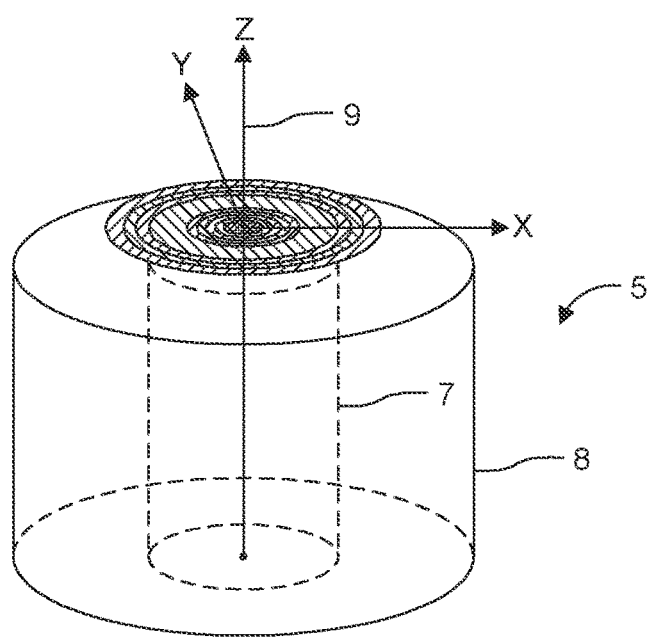
FIG. 6 illustrates a back bias magnet that is an axially polarized cylinder and includes a bore according to one or more embodiments.

For example, FIG. 6 illustrates a back bias magnet 5 that is an axially polarized cylinder and includes a bore 10 according to one or more embodiments. FIG. 6 further shows the in-plane magnetic field distribution in the sensor plane. The magnetic flux density is zero in the center of the plane and changes in the radial direction in the sensor plane such that it is also zero at the zero-field circle 12. Thus, due to the radially symmetric field distribution, all four sensor elements 20 are exposed to substantially the same (due to typical assembly tolerances of 3%), or exactly the same magnetic field working point.

Figure 7:
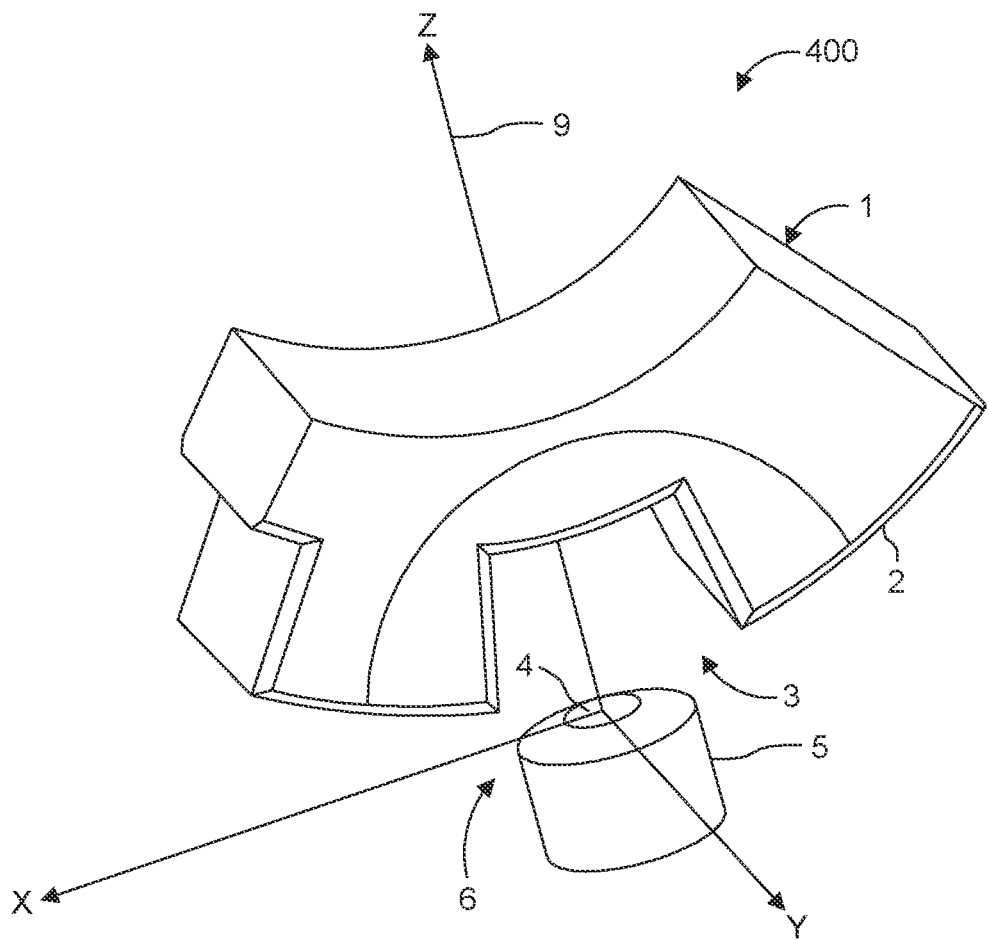
FIG. 7 illustrates a speed sensing system, including a sensor module, according to one or more embodiments.

FIG. 7 illustrates a speed sensing system 400, including a sensor module 6, according to one or more embodiments. In particular, a portion of wheel 1 is shown with an air gap between the wheel 1 and the sensor module 6, and, more particularly, between the wheel 1 and the sensor arrangement 4. The sensor arrangement 4 is disposed on or coupled to the cylinder back bias magnet 5 such that the center point between the sensor elements 20 (e.g., the center of circle 12) is aligned on the center axis 9 of the magnet 5. As described above, the sensor arrangement 4 (i.e., the sensor) includes magnetic sensor elements 20 and an IC for signal conditioning.

Figure 8:
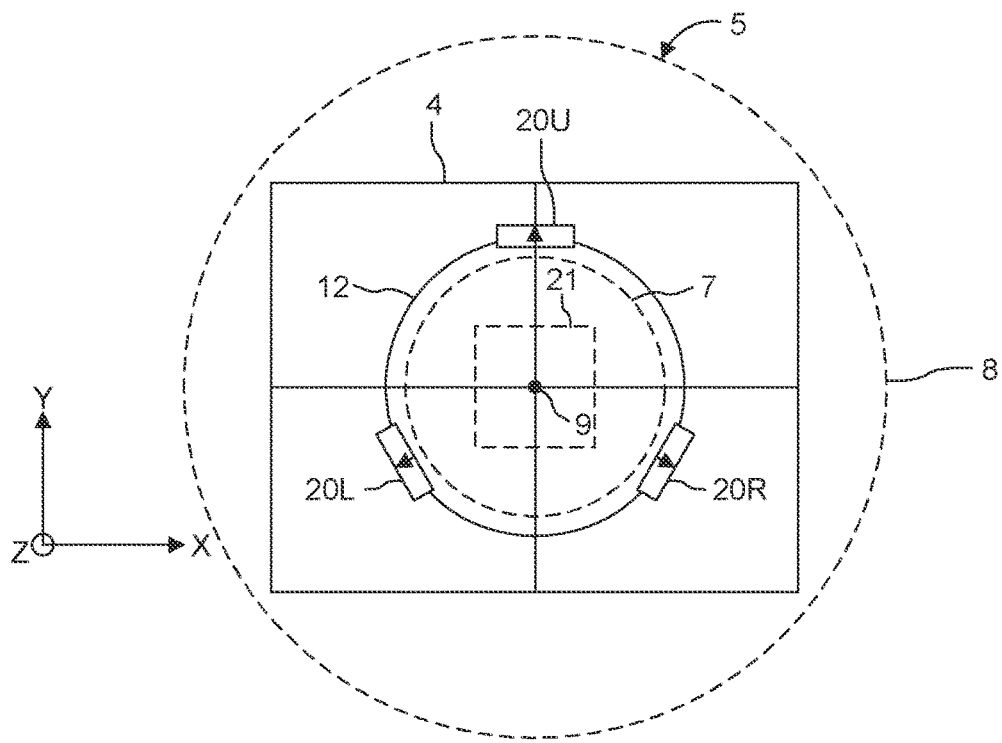
FIG. 8 illustrates a plan view of another sensor module, including a sensor arrangement arranged over a back bias magnet, according to one or more embodiments.

FIG. 8 illustrates a plan view of another sensor module, including a sensor arrangement arranged over a back bias magnet, according to one or more embodiments. In this case, three magnetic field sensor elements 20L, 20R, and 20U are provided. The sensor elements 20 are arranged on a circumference of the zero-field circle 12 with equidistant spacing from each other. Thus, the sensor elements 20 are spatially distributed equally about a center of the zero-field circle 12 such that all sensor elements 20 are exposed to substantially the same (due to typical assembly tolerances of 3%), or exactly the same magnetic field working point.

As described above, each point on the zero-field circle 12 experiences a zero magnetic flux density. In a preferred case, all sensor elements 20 are exposed to a zero in-plane magnetic field Bxy but may be exposed to a residual offset field if not place exactly on the zero-field circle 12. As a result of their arrangement on the zero-field circle 12 that is generated due to the bore 10 or substantially proximate to the zero-field circle 12, all sensor elements are always operated in linear mode (i.e., non-saturated mode) regardless of the overall magnetization strength of the magnet 5.

For each sensing element 20, the corresponding sensing axis is aligned in a radial or anti-radial direction of the in-plane field and are insensitive to other magnetic in-plan field components. The three sensing signals from the three sensing elements 20L, 20R, and 20U can be combined in arbitrary way by the sensor circuit 21 to generate an output signal.

From the three sensor elements 20, three differential signals are obtained by the sensor circuit 21, including $\Delta 1$=BradialUP−BradialLEFT, $\Delta 2$=BradialLEFT−BradialRIGHT, $\Delta 3$=BradialRIGHT−BradialUP, where BradialUP is the sensor signal generated by sensor element 20U, BradialLEFT is the sensor signal generated by sensor element 20L, and BradialRIGHT is the sensor signal generated by sensor element 20R. The three differential signals may then be added by the sensor circuit 21 to generate the sensor output signal $SE_{OUT}$.

The sensor signals of each sensor element 20 is provided to the sensor circuit 21 that calculates the three differential signals $\Delta 1$, $\Delta 2$ and $\Delta 3$ and/or an output signal using a differential calculation, and out-of-plane magnetic field components do not affect the output signal (i.e., the sensor output).

Figure 9:
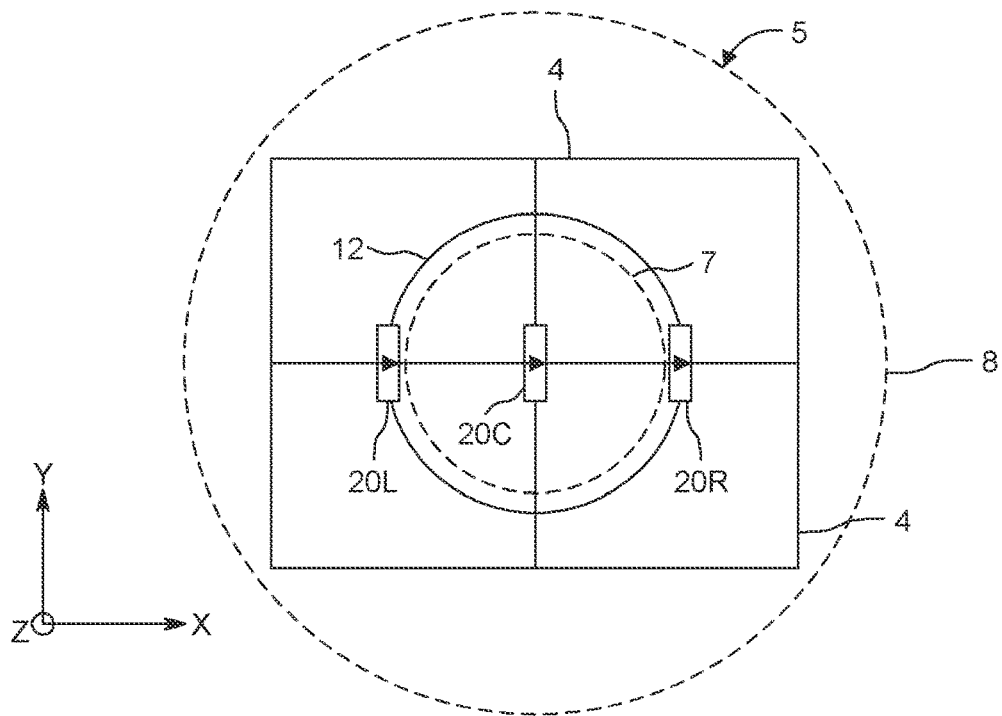
FIG. 9 illustrates a plan view of another sensor module, including a sensor arrangement arranged over a back bias magnet, according to one or more embodiments.

FIG. 9 illustrates a plan view of another sensor module, including a sensor arrangement arranged over a back bias magnet, according to one or more embodiments. In this case, three magnetic field sensor elements 20L, 20R, and 20C are provided. The sensor elements 20 are linearly arranged with respect to each other with two of the sensor elements 20L and 20R arranged on a circumference of the zero-field circle 12 with equidistant spacing from the center sensor element 20C. The center sensor element 20C is arranged on an extension of the center axis 9 of the bore 10, which also coincides with the center of the inner circumference 7, the center of the zero-field circle 12, and the center of the outer circumference 8. In other words, each sensor element 20 is arranged in a location that has a zero-magnetic field offset where the magnetic flux density of the magnetic in-plane field produced by the magnet 5 is zero or substantially zero.

In this example, the sensor elements 20 are linearly arranged along the x-axis and each have a sensing axis aligned with the x-direction for measuring the magnetic field component Bx. Alternatively, the sensing axis may be aligned with the negative x-direction for measuring the magnetic field component −Bx. Alternatively, the sensor elements 20 may be linearly arranged along the y-axis and each have a sensing axis aligned with either the positive y-direction or the negative y-direction. Alternatively, the sensor elements 20 may be linearly arranged along some other (i.e., arbitrary) in-plane axis with their sensing axis pointing in the same direction. In each case, the center sensor element 20C is arranged at an extension of the center axis 9 (at the center of the zero-field circle 12) and the other sensor elements are arranged equidistant therefrom on the zero-field circle 12.

Sensor signals generated from the two outer sensor elements 20 (i.e., sensor elements 20L and 20R) are received by the sensor circuit 21 and may be used thereby to generate a first differential measurement signal (e.g., $\Delta 1$=Left−Right or in a magnetic field representation, $\Delta 1$=BxLeft−BxRight). Additionally, the sensor signal generated by the center sensor element 20C are received by the sensor circuit 21 and may be used thereby as a second measurement signal $SE_M$ for generating a second differential measurement signal $SE_{OUT}$ (e.g., $SE_{OUT}$=Center−(Left+Right)/2. The signals $\Delta 1$ and $SE_{OUT}$ are 90° phase shifted to each other and can be used to determine speed and rotation direction of the rotating target As described above, each point on the zero-field circle 12 experiences a zero in-plane magnetic flux density. In a preferred case, all sensor elements 20 are exposed to a zero in-plane magnetic field Bxy. As a result of their arrangement on the zero-field circle 12 that is generated due to the bore 10 or substantially proximate to the zero-field circle 12, all sensor elements are always operated in linear mode (i.e., non-saturated mode) regardless of the overall magnetization strength of the magnet 5. As before, each sensor's transfer function has a high linear range (minimum of +/−25 mT) and is in a wide range independent from bias fields. That is, each sensor element 20 is sensitive to a first magnetic in-plane field component (e.g., a Bx component or By component) and, at the same time, it is independent from (or insensitive to) a second, different magnetic in-plan field component (e.g., a By component or a Bx component).

In view of the above embodiments, at least two sensor elements 20 are provided in the sensor arrangement 4, where two or more of the sensor elements 20 are arranged on the zero-field circle 12. In some cases, one additional sensor element 20C is arranged at an extension of the center axis 9 of the magnet 5 at the center point of the zero-field circle 12. The center sensor element 20C may also be used in combination with the sensor arrangements illustrated in FIGS. 5 and 8. Alternatively, all sensor elements 20 of the sensor may arranged on the zero-field circle 12.

FIGS. 10A-10D illustrate sensor signals of a sensor elements of a sensor shown in FIG. 5 verse a rotation angle of a target wheel according to one or more embodiments. Additionally, FIG. 10E illustrates output sensor signals of a sensor circuit of a sensor shown in FIG. 5 verse a rotation angle of a target wheel according to one or more embodiments.

Figure 10A:
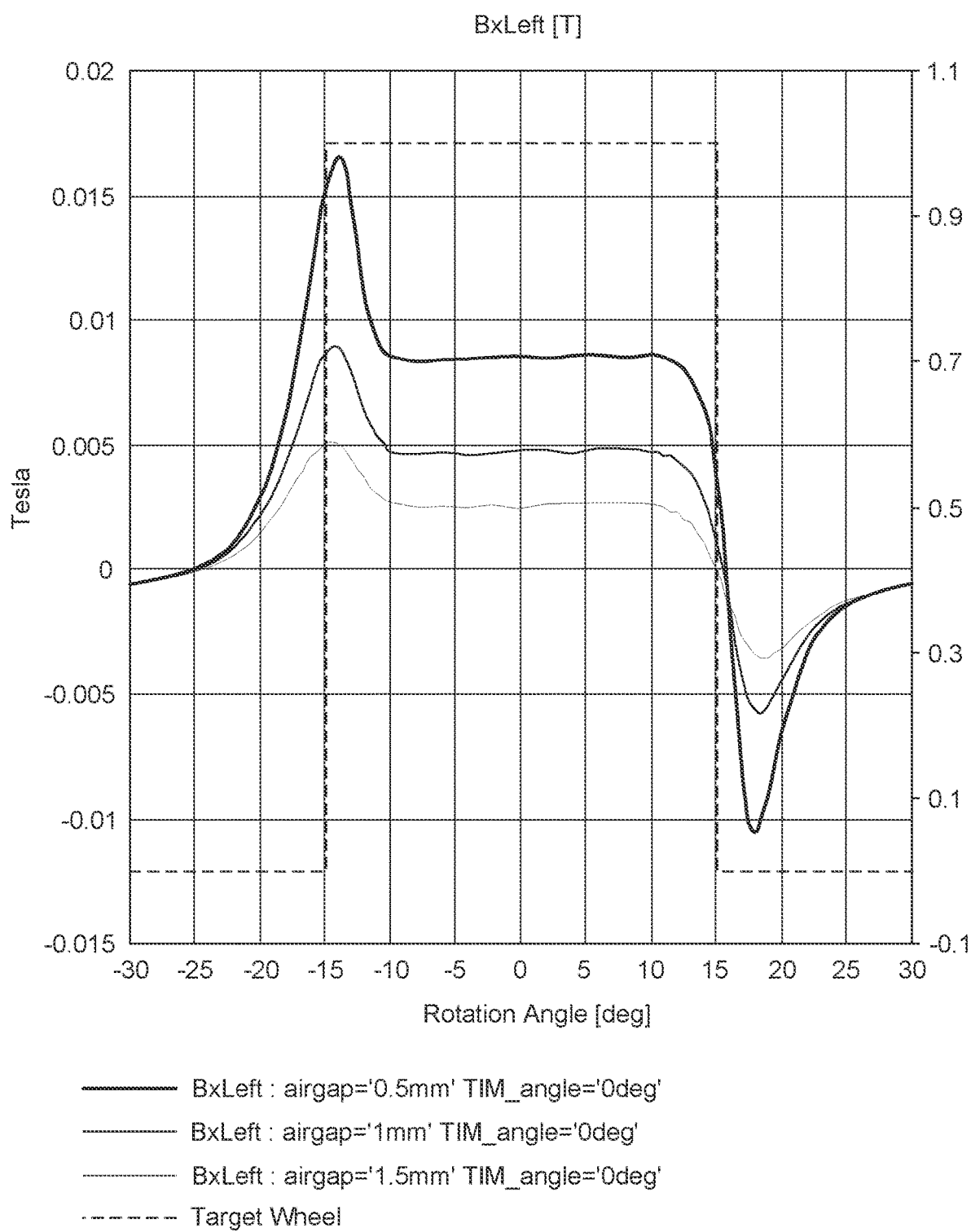
FIGS. 10A-10D illustrate sensor signals of a sensor elements of a sensor shown in FIG. 5 verse a rotation angle of a target wheel according to one or more embodiments.
Figure 10B:
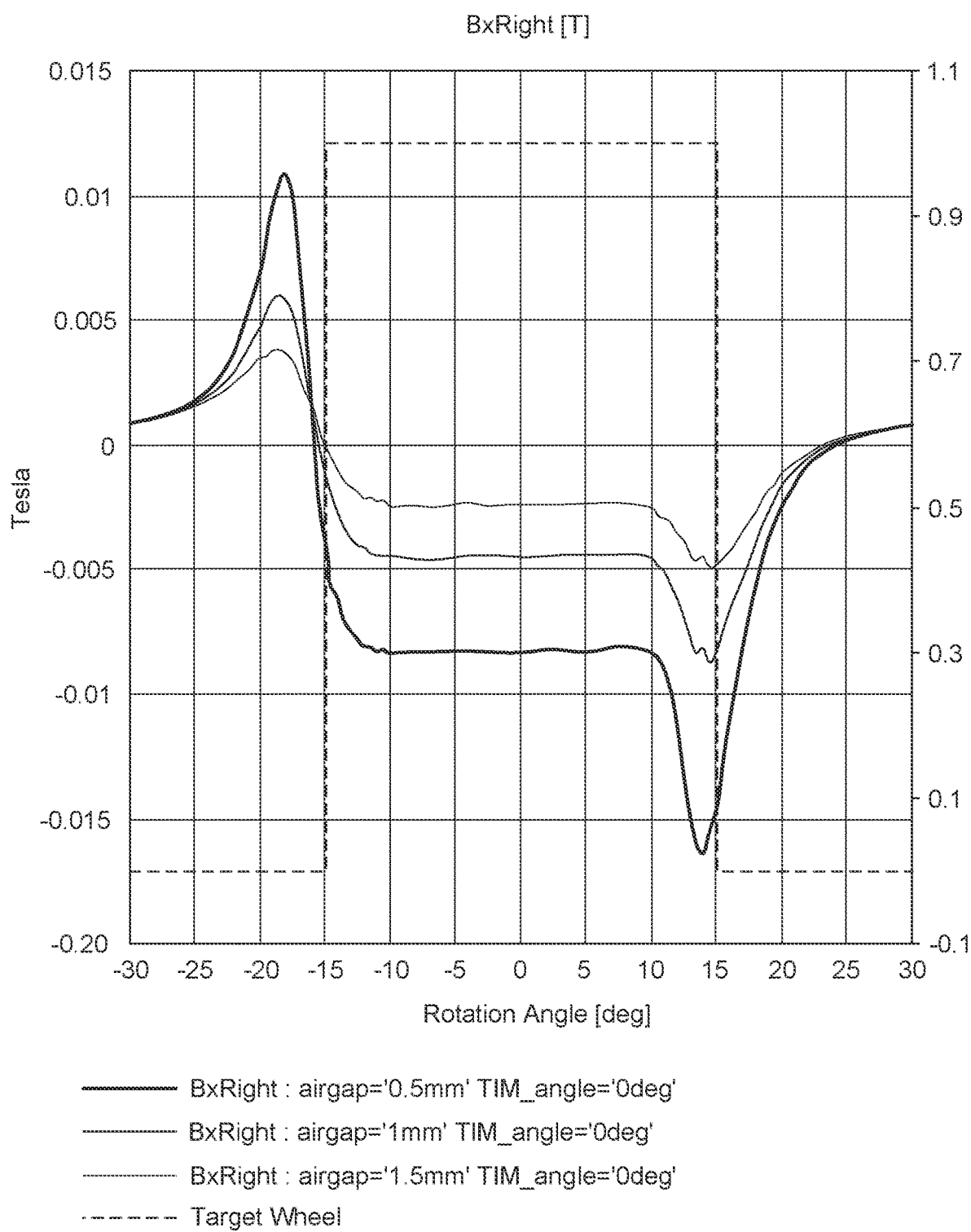
Figure 10C:
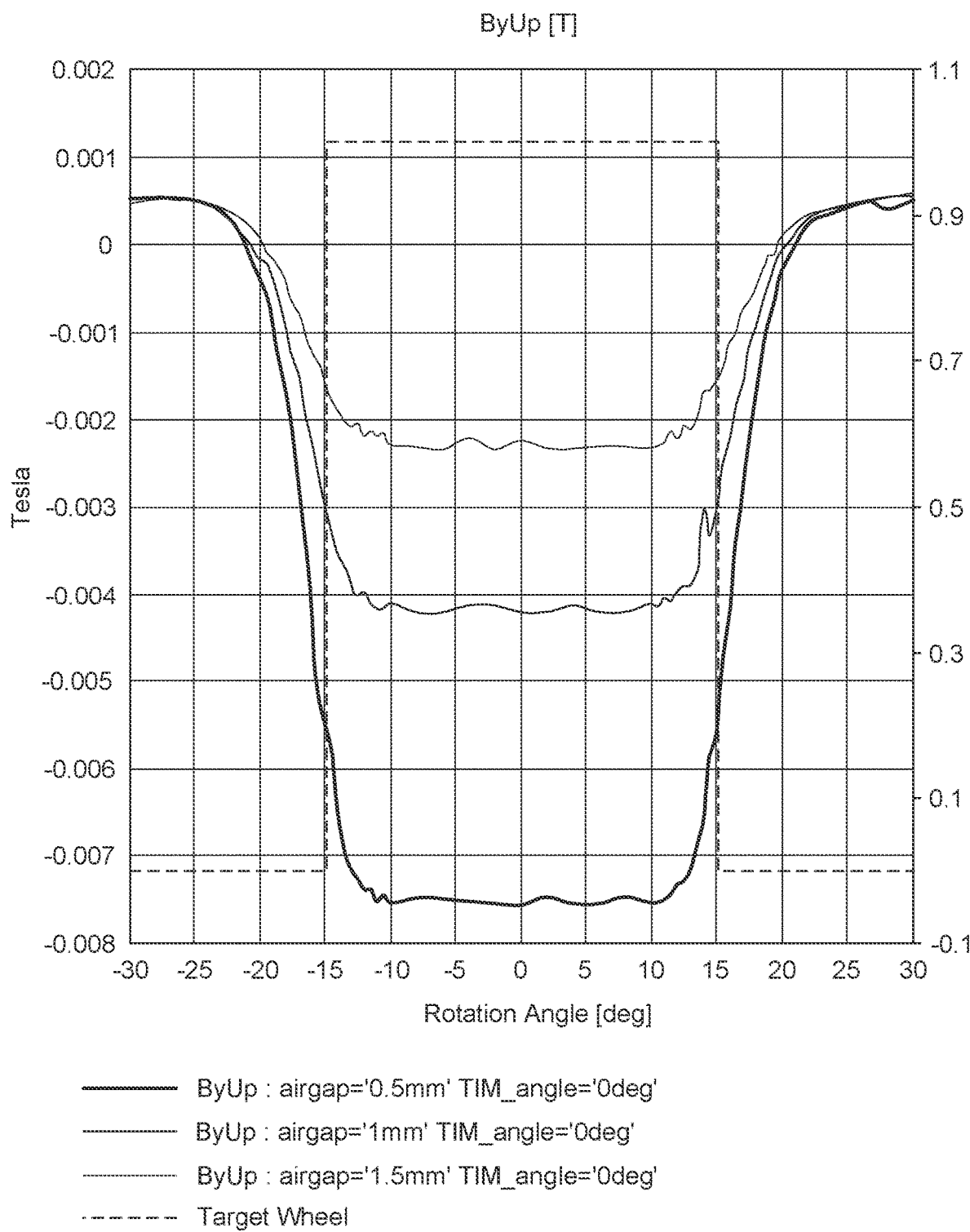
Figure 10D:
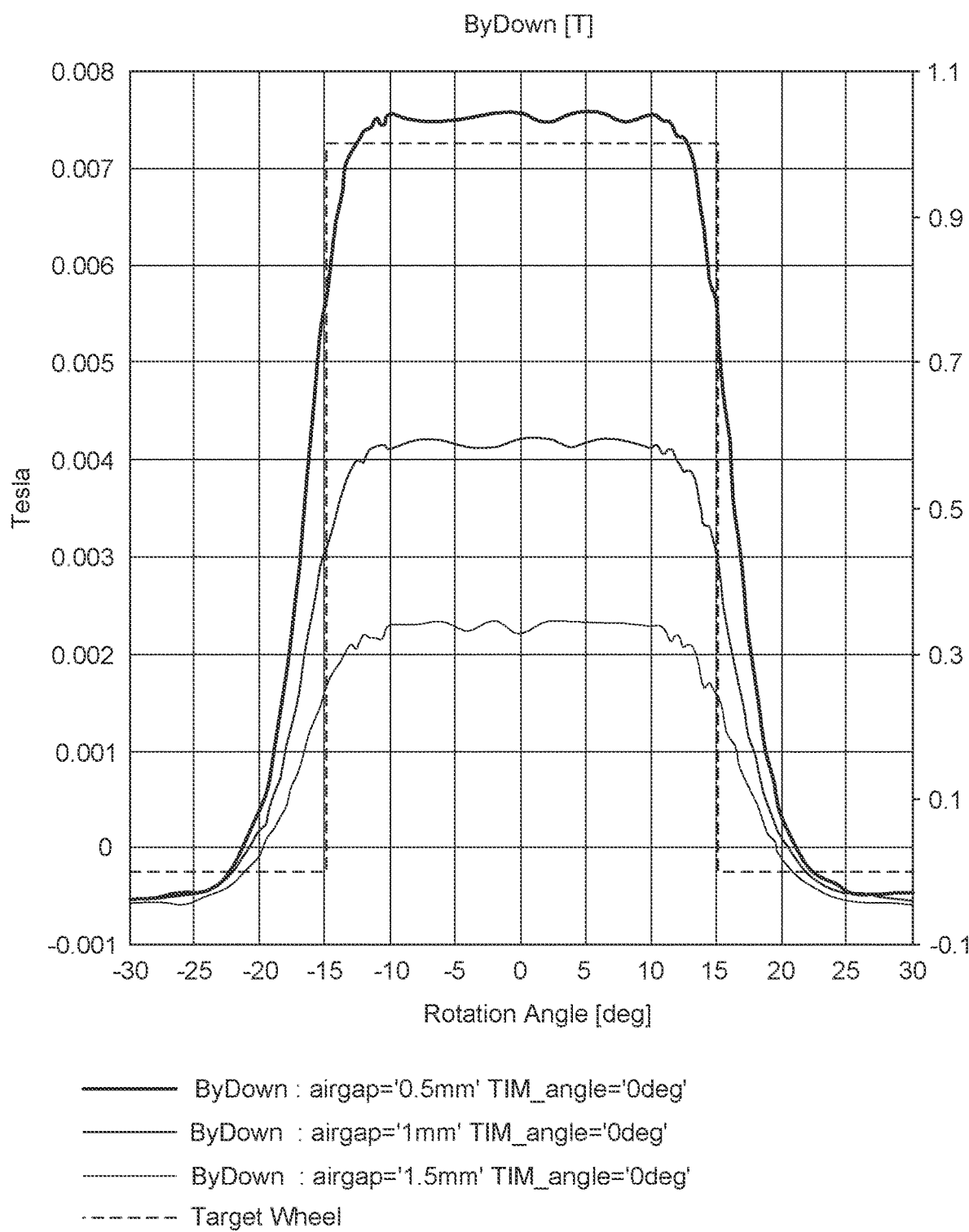
Figure 10E:
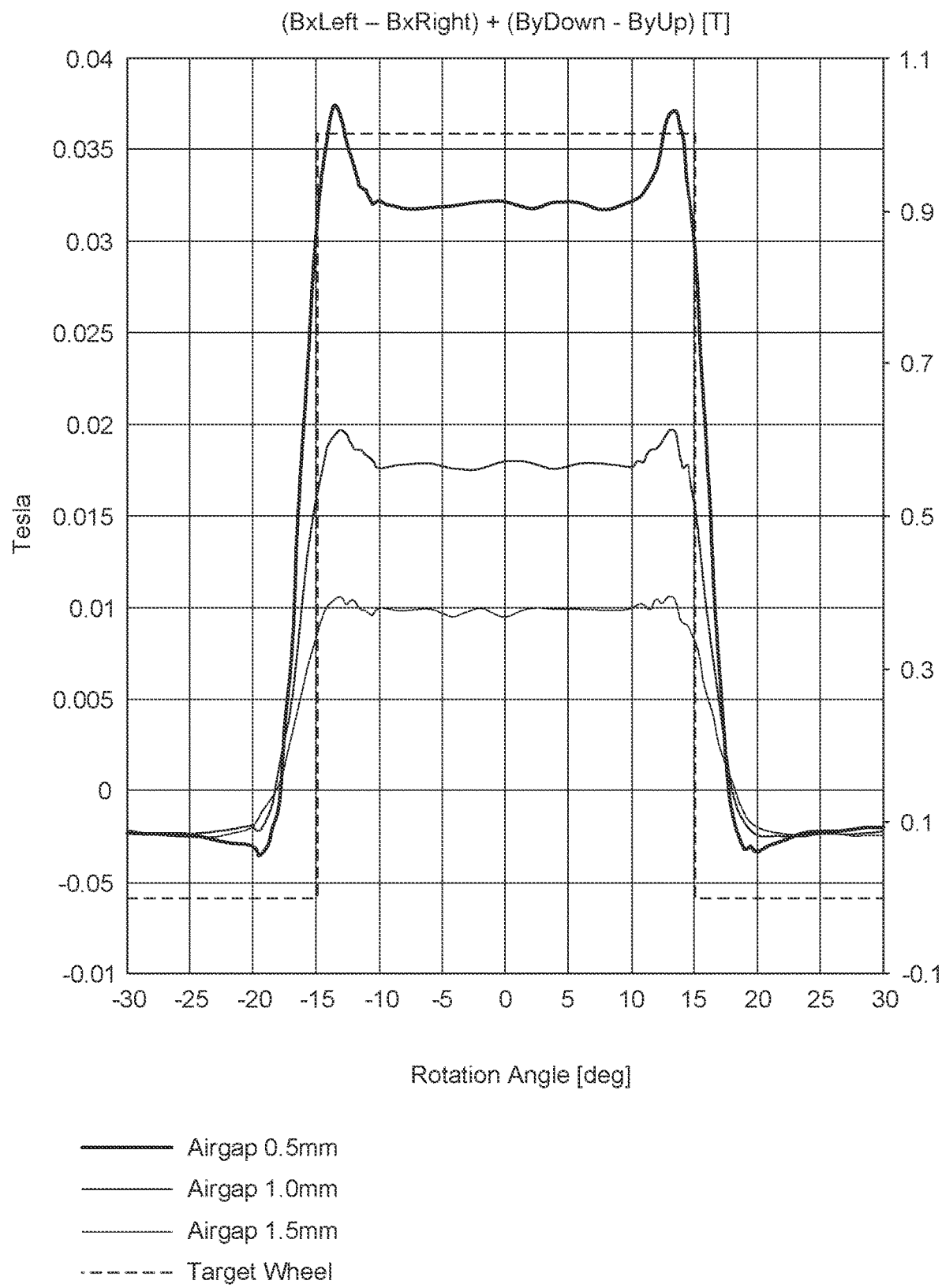
FIG. 10E illustrates output sensor signals of a sensor circuit of a sensor shown in FIG. 5 verse a rotation angle of a target wheel according to one or more embodiments.

In other words, the sensor signals shown in FIG. 10A are representative of sensor signal $SE_A$ according to different airgaps between the sensor arrangement 4 and the toothed wheel 1, the sensor signals shown in FIG. 10B are representative of sensor signal $SE_B$ according to different airgaps between the sensor arrangement 4 and the toothed wheel 1, the sensor signals shown in FIG. 10C are representative of sensor signal $SE_C$ according to different airgaps between the sensor arrangement 4 and the toothed wheel 1, the sensor signals shown in FIG. 10D are representative of sensor signal $SE_D$ according to different airgaps between the sensor arrangement 4 and the toothed wheel 1, and the output sensor signals shown in FIG. 10E are representative of the sensor output $SE_{OUT}$ according to different airgaps between the sensor arrangement 4 and the toothed wheel 1 calculated according to Equation (5). The shape of the target wheel (tooth 2 and notches 3) is represented by a rectangular shaped function in each graph.

Figure 10F:
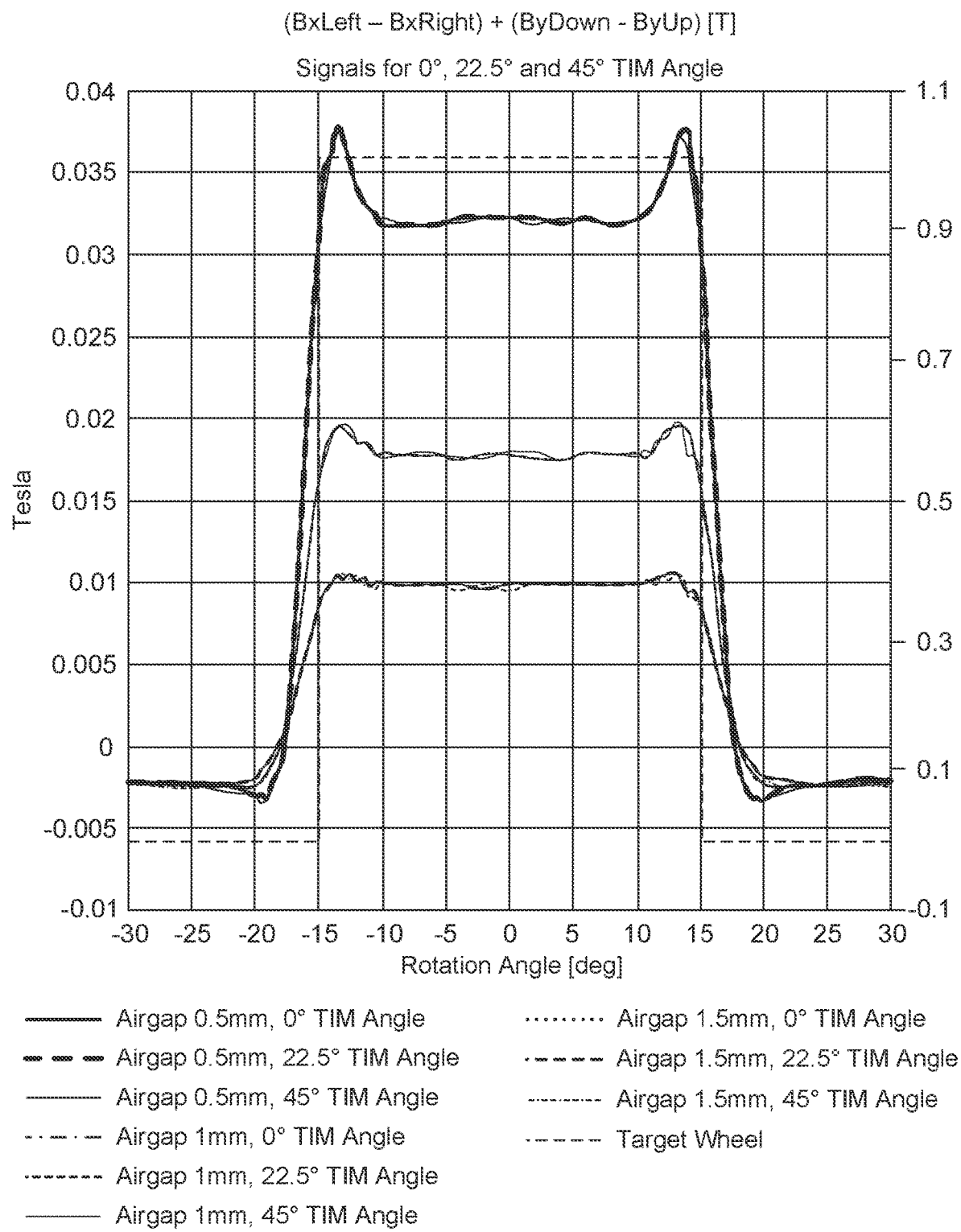
FIG. 10F illustrates output sensor signals for different Twist Insensitive Mounting (TIM) angles of the sensor module shown in FIG. 5 verse a rotation angle of a target wheel according to one or more embodiments.

Additionally, FIG. 10F illustrates output sensor signals for different TIM angles of the sensor module shown in FIG. 5 verse a rotation angle of a target wheel according to one or more embodiments. Different twist angles (0°, 22.5° and 45°) of the sensor module 6 around its z-axis are superimposed for each air gap.

As can be seen, the twist of the sensor module 6 about the z-axis has little effect on the output signals and there is essentially no phase variation induced by the TIM angle. In particular, the rotation of the target wheel modulates the magnetic field, and a clear signal change (modulation) as a function of the wheel rotation angle is generated by the sensor circuit 21 independent of the TIM angle of the sensor module 6. This phenomenon is observed from the nearly overlapping curves for the different twist angles for each air gap shown in FIG. 10F.

In view of FIGS. 10A-10F, the output signal may be independent from the mounting angle (i.e., independent of a twisting angle around its z-axis). The sensor arrangement 4 may be robust against stray-fields due to differential signal calculation that cancels out homogeneous stray-fields in both in-plane directions (i.e., the x and y-planes), and out-of-plane magnetic field components do not affect the output signal. The output signal of the sensor circuit 21 complies with output switching on the tooth edge. Thus, there is no need to reconfigure an external control unit (e.g., an ECU) during installation. Furthermore, a simple axially polarized cylinder back bias magnet with a center bore or cavity is sufficient. Accordingly, the described embodiments offer stray-field robust, twist-insensitive sensing of the wheel, and it comes with a low cost magnetic back bias solution (e.g., a sintered ferrite cylinder magnet). Alternatively, other types of magnets (e.g., a rare earth magnet) may also be suitable as a back bias magnet.

The low magnetic field offset that can be seen by the sensor in the region of the notch 3 of the tooth wheel 1 can also be useful for the lifetime stability and true power on feature. TPO means the sensor circuit 21 is able to detect directly at startup the correct position of the wheel 1 (e.g., it detects whether there is a tooth or notch in front of it). This is realized by a threshold value. If the sensed field exceeds the threshold, then there is a tooth. If the sensed field is smaller than the threshold, then there is a notch. In case of magnet degradation over its lifetime (i.e., magnet loses its strength), the magnetic offset will still be at or close to zero. Thus, there is little to no impact on the performance of the sensor or its capability to detect a tooth or notch at startup despite a degradation of the magnet.

Figure 11:
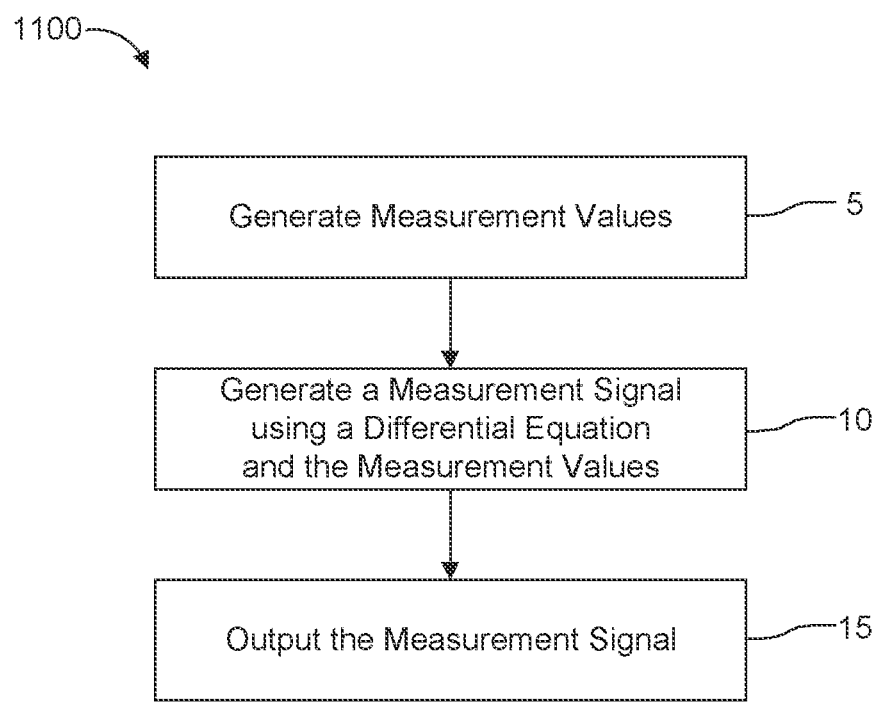
FIG. 11 illustrates a flow diagram of a method of measuring a rotational speed of a rotating member by a magnetic sensor according to one or more embodiments.

FIG. 11 illustrates a flow diagram of a method 1100 of measuring a rotational speed of a rotating member by a magnetic sensor according to one or more embodiments. As noted above, the magnetic sensor including a plurality of sensor elements arranged in a sensor plane of the magnetic sensor and are exposed to substantially the same working point of a radially symmetric bias magnetic field produced by an axially polarized back bias magnet that has a bore.

The method includes generating measurement values by a plurality of sensor elements in response to sensing the radially symmetric bias magnetic field (operation 5). The variations in the measurement values of the plurality of sensor elements are caused by a rotation of the rotating member.

The method 1100 further includes generating a measurement signal using at least one differential calculation with the measurement values as inputs to the differential calculation (operation 10). The differential calculation, performed by a processor, is configured to, based on the measurement values, cancel out stray-fields along at least one sensitivity direction. For example, a first pair of sensor elements are sensitive to a first in-plane magnetic field component of the radially symmetric bias magnetic field in the direction of the first sensitivity-axis, and a second pair of sensor elements are sensitive to a second in-plane magnetic field component of the radially symmetric bias magnetic field in the direction of the second sensitivity-axis. Accordingly, the measurement signal oscillates between maximum and minimum values based on a rotational speed of the rotating member.

Lastly, the method 1100 includes outputting the measurement signal to an external device (operation 15), such as an ECU, for further processing. The measurement signal may be output by transmission along a wired connection or a wireless connection.

In view of the above, assembly tolerances can be relaxed by implementing the sensor modules described above due to their twist-insensitivity and stray-field robustness.

While the above embodiments are described in the context of detecting a wheel or camshaft speed, the sensor may be used to detect the rotation speed of any rotating member or object that creates sinusoidal variations in a magnetic field as it rotates and that may be sensed by a sensor, including a crankshaft and transmission speed sensing. For example, a combination of a ferrous wheel and a back bias magnet may be used to generate a time varying magnetic field.

Further, while various embodiments have been described, it will be apparent to those of ordinary skill in the art that many more embodiments and implementations are possible within the scope of the invention. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A magnetic sensor module configured to detect a rotation of an object, comprising:
    an axially polarized back bias magnet comprising a magnet body that extends in a radial direction from an inner sidewall to an outer sidewall and a bore that defines the inner sidewall, wherein the axially polarized back bias magnet generates a radial bias magnetic in-plane field in a sensor plane that is orthogonal to an extension of a magnet center axis of the axially polarized back bias magnet, wherein the bore is centered on the magnet center axis and extends along the magnet center axis in an axial direction of the axially polarized back bias magnet, wherein the radial bias magnetic in-plane field has a magnetic flux density of substantially zero at the magnet center axis and along a perimeter of a zero-field closed loop located in the sensor plane, wherein the perimeter of the zero-field closed loop encircles the extension of the magnet center axis, wherein the perimeter of the zero-field closed loop vertically overlaps with the magnet body in a plan view; and
    a magnetic sensor including a plurality of sensor elements arranged in the sensor plane of the magnetic sensor at locations where the radial bias magnetic in-plane field has the magnetic flux density of substantially zero, wherein the plurality of sensor elements are configured to generate measurement values in response to sensing the radial bias magnetic in-plane field,
    wherein at least two of the plurality of sensor elements are arranged on the perimeter of the zero-field closed loop at substantially equidistant angles about the magnet center axis of the axially polarized back bias magnet.

2. The magnetic sensor module of claim 1, wherein one sensor element of the plurality of sensor elements is arranged on the extension of the magnet center axis.

3. The magnetic sensor module of claim 2, wherein the magnetic flux density of substantially zero means less than 15 milliteslas (mT).

4. The magnetic sensor module of claim 1, wherein one sensor element of the plurality of sensor elements is arranged on the magnet center axis.

5. The magnetic sensor module of claim 4, wherein three sensor elements of the plurality of sensor elements are linearly arranged along an in-plane axis of the sensor plane, wherein the in-plane axis is orthogonal to the magnet center axis.

6. The magnetic sensor module of claim 1, wherein the perimeter of the zero-field closed loop is defined as an area in the sensor plane where the magnetic flux density of the radial bias magnetic in-plane field is less than 15 milliteslas (mT).

7. The magnetic sensor module of claim 1, wherein the perimeter of the zero-field closed loop is defined as an area in the sensor plane where the magnetic flux density of the radial bias magnetic in-plane field is zero.

8. The magnetic sensor module of claim 1, wherein the axially polarized back bias magnet generates the radial bias magnetic in-plane field that is zero at the magnet center axis, increases in the radial direction in the sensor plane from the magnet center axis to a first radial distance, decreases in the radial direction in the sensor plane from the first radial distance to a second radial distance that defines a portion of the perimeter of the zero-field closed loop, and increases in the radial direction in the sensor plane from the second radial distance to a third radial distance that defines the outer sidewall.

9. The magnetic sensor module of claim 8, wherein the second radial distance is located between the inner sidewall and the outer sidewall.

10. The magnetic sensor module of claim 1, wherein the bore extends from a first end to a second end.

11. The magnetic sensor module of claim 1, wherein the bore extends from a first end partially towards a second end.

12. The magnetic sensor module of claim 1, wherein the bore extends partially between a first closed end and a second closed end.

13. The magnetic sensor module of claim 1, wherein the magnetic sensor further comprises a sensor circuit configured to receive the measurement values from the plurality of sensor elements, and generate a measurement signal using at least one differential calculation configured to cancel out stray-fields present along at least one sensitivity-axis of the magnetic sensor based on the received measurement values.

14. The magnetic sensor module of claim 1, wherein the magnetic sensor module is twist-insensitive about the magnet center axis of the axially polarized back bias magnet.

15. A magnetic sensor module configured to detect a rotation of an object, comprising:
an axially polarized back bias magnet comprising a magnet body that extends in a radial direction from an inner sidewall to an outer sidewall and a bore that defines the inner sidewall, wherein the axially polarized back bias magnet generates a radial bias magnetic in-plane field in a sensor plane that is orthogonal to an extension of a magnet center axis of the axially polarized back bias magnet, wherein the bore is centered on the magnet center axis and extends along the magnet center axis in an axial direction of the axially polarized back bias magnet, wherein the radial bias magnetic in-plane field has a magnetic flux density of substantially zero at the magnet center axis and along a perimeter of a zero-field closed loop located in the sensor plane, wherein the perimeter of the zero-field closed loop encircles the extension of the magnet center axis; and
a magnetic sensor including a plurality of sensor elements arranged in the sensor plane of the magnetic sensor at locations where the radial bias magnetic in-plane field has the magnetic flux density of substantially zero, wherein the plurality of sensor elements are configured to generate measurement values in response to sensing the radial bias magnetic in-plane field,
wherein at least two of the plurality of sensor elements are arranged on the perimeter of the zero-field closed loop at substantially equidistant angles about the magnet center axis of the axially polarized back bias magnet.

* * * * *